United States Patent
Park et al.

(10) Patent No.: US 8,154,910 B2
(45) Date of Patent: Apr. 10, 2012

(54) FULL CMOS SRAM

(75) Inventors: Han-byung Park, Seongnam-si (KR); Hoon Lim, Seoul (KR); Hoo-sung Cho, Yongin-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 274 days.

(21) Appl. No.: 12/686,545

(22) Filed: Jan. 13, 2010

(65) Prior Publication Data

US 2010/0195375 A1 Aug. 5, 2010

(30) Foreign Application Priority Data

Jan. 30, 2009 (KR) .................................. 2009-7386

(51) Int. Cl.
*G11C 11/00* (2006.01)
(52) U.S. Cl. ........................................ 365/154; 365/156
(58) Field of Classification Search .................. 365/154, 365/156; 257/69, 72, 903
See application file for complete search history.

(56) References Cited

U.S. PATENT DOCUMENTS

| 5,517,038 A * | 5/1996 | Maeda et al. ............... 257/69 |
| 6,620,659 B2 * | 9/2003 | Emmma et al. ............. 438/154 |
| 7,280,397 B2 * | 10/2007 | Scheuerlein ............. 365/185.08 |

FOREIGN PATENT DOCUMENTS

| JP | 2004-221377 | 8/2004 |
| KR | 2003-21652 | 3/2003 |
| KR | 2003-60142 | 7/2003 |
| KR | 2003-75463 | 9/2003 |

* cited by examiner

*Primary Examiner* — Vu Le
(74) *Attorney, Agent, or Firm* — Stanzione & Kim, LLP

(57) ABSTRACT

A full complementary metal-oxide semiconductor (CMOS) static random access memory (SRAM) may have a reduced cell size by arranging a word line of a pair of transistors arranged on the uppermost layer of the SRAM. First and second transistors may be arranged on first and second active regions. Third and fourth transistors may be arranged on first and second semiconductor layers formed over the first and second active regions. Fifth and sixth transistors may be arranged on the third and fourth semiconductor layers over the first and second semiconductor layers. A word line may be arranged in a straight line between the first and second gates of the first and second transistors and between the third and fourth gates of the third and fourth transistors.

26 Claims, 18 Drawing Sheets

FULL CMOS SRAM

CROSS-REFERENCE TO RELATED APPLICATIONS

This application claims the benefit of Korean Patent Application No. 10-2009-0007386, filed on Jan. 30, 2009, in the Korean Intellectual Property Office, the disclosure of which is incorporated herein in its entirety by reference.

BACKGROUND

1. Field of the Invention

The inventive concept relates to a semiconductor memory device, and more particularly, to a full complementary metal-oxide semiconductor (CMOS) static random access memory (SRAM) device having a layout in which the cell size can be readily reduced

2. Description of the Related Art

Of the semiconductor memory devices, SRAMs have characteristics such as low power consumption and fast response time when compared to dynamic random access memories (DRAMs), and are widely used in cache memory devices or mobile electronic products. Unit memory cells of an SRAM are classified as SRAM cells that use high value resistors as load devices and CMOS SRAM cells that use PMOS transistors as load devices. Also, the unit memory cells of the SRAM are classified as thin film transistor SRAM cells that use thin film transistors as load devices and bulk CMOS SRAM cells that use bulk transistors as load devices.

A bulk CMOS SRAM cell includes a pair of driving transistors, a pair of load transistors, and a pair of transmission transistors. The pair of driving transistors and the pair of transmission transistors are NMOS transistors and the pair of load transistors includes PMOS transistors. The bulk CMOS SRAM cell has high cell stability, but it has a low degree of integration and poor latch-up immunity due to a large cell size, since source and drain regions of the six transistors and channel regions of the six transistors are arranged in a plane on a substrate.

In a stack-type SRAM, the three pairs of transistors are stacked on layers different from each other to increase integration. In the stack-type SRAM, word lines, which are arranged on the uppermost layer and are connected to transistors, are arranged in a zigzag shape having a slant line, and thus, there is a limit to an ability to reduce cell size. Also, due to the slant line of the word lines, an align margin between neighboring bit line contact nodes is narrow and the current distribution of the transistors is not uniform. The align margin between the word lines and the bit line contact nodes is further reduced with the increase in integration. Accordingly, it is further difficult to perform a photographic process with respect to the word lines, and thus, the cell size cannot be readily reduced.

SUMMARY

The present general inventive concept provides a full complementary metal-oxide semiconductor (CMOS) static random access memory (SRAM) in which the cell size can be readily reduced by improving an align margin between a word line and bit line contact nodes through arranging the word line in a straight line.

Additional aspects and utilities of the present general inventive concept will be set forth in part in the description which follows and, in part, will be obvious from the description, or may be learned by practice of the general inventive concept.

According to an aspect of the inventive concept, there is provided a full CMOS SRAM. The full CMOS SRAM may include a semiconductor substrate having a plurality of cell regions arranged in an array form in first direction and second direction perpendicular to the first direction, and a plurality of memory cells arranged in each of the cell regions. Each of the memory cells may include a pair of first transistors arranged on the semiconductor substrate, a pair of second transistors arranged on a first layer over the semiconductor substrate, and a pair of third transistors arranged over the first layer. A word line that includes gates of the pair of third transistors may be arranged in a straight line in the first direction. A pair of bit lines may be arranged to cross the word line in the second direction. The word line may be extended in a straight line in the first direction across cell regions which are arranged in the first direction. The word line may be arranged parallel to the word lines arranged in the cell regions neighboring in a second direction which crosses the first direction.

Additional features and/or utilities of the present general inventive concept may be realized by a full CMOS SRAM. The full CMOS SRAM may include a semiconductor substrate having a first active region and a second active region which are arranged apart from each other and both extend in a first direction. A first transistor may be arranged in the first active region and may include a first gate, a first source region, and a first drain region. A second transistor may be arranged in the second active region and may include a second gate, a second source region, and a second drain region. A third transistor may be arranged in a first layer on the semiconductor substrate and may include a third gate, a third source region, and a third drain region. A fourth transistor may be arranged in the first layer and may include a fourth gate, a fourth source region, and a fourth drain region. A fifth transistor may be arranged in a second layer over the first layer and may include a fifth gate, a fifth source region, and a fifth drain region. A sixth transistor may be arranged on the second layer and may include a sixth gate, a sixth source region, and a sixth drain region. A word line may be arranged in a straight line over the second layer in a second direction crossing the first direction between the first gate and the second gate and between the third gate and the fourth gate.

The first drain region, the third drain region, and the fifth source region may be electrically connected to each other through a first contact node. The second drain region, the fourth drain region, and the sixth source region may be electrically connected to each other through a second contact node. The word line may be arranged in a straight line in the second direction between the first contact node and the second contact node.

The first layer may include first and second semiconductor layers arranged over the semiconductor substrate to overlap the first and second active regions. The second layer may include third and fourth semiconductor layers that are arranged over the first and second semiconductor layers to overlap the first and second active regions and the first and second semiconductor layers.

The fifth gate may include a first portion of the word line that overlaps the third semiconductor layer, and the sixth gate may include a second portion of the word line that overlaps the fourth semiconductor layer. The first and second gates may cross the first and second active regions in the second direction, and the third and fourth gates may cross the first and second semiconductor layers in the second direction. The first and second gates may overlap the third and fourth gates.

Additional features and/or utilities of the present general inventive concept may be realized by a CMOS SRAM device including at least one cell. The cell may include a first layer including a first transistor and a second transistor, a second layer above the first layer including a third transistor and a fourth transistor, and a third layer including a fifth transistor and a sixth transistor. Each transistor of the first through sixth transistors may include a source and a drain, each extending in a first direction, and a gate extending in a second direction to cross the first direction, and a gate of the fifth transistor may be connected to and linearly contiguous with a gate of the sixth transistor.

A source of the third and fourth transistors may be connected to a first voltage source and a source of the first and second transistors may be connected to a second voltage source. The second voltage source is a ground source.

The CMOS SRAM device may include a first electrical node and a second electrical node. The first electrical node may be connected to a drain of the first and third transistors, a source of the fifth transistor, and a gate of the second and fourth transistors. The second electrical node may be connected to a drain of the second and fourth transistors, a source of the sixth transistor, and a gate of the first and third transistors. Each node may include a conductive plug.

The gates of the first through fourth transistors, respectively, may include a main portion extending in a first direction and an offset portion extending in the first direction and offset from the main portion by a predetermined distance in a second direction perpendicular to the first direction. The main portions of the first through fourth transistors may be connected to the sources and drains of the respective first through fourth transistors, and the offset portions of the gates of the first through fourth transistors may be connected to the respective nodes.

The first layer may include a substrate and a first sub-layer above the substrate. The sources and drains of the first and second transistors may be located in the substrate, may be separated from each other, and may be substantially parallel to each other. The gates of the first and second transistors may extend parallel to each other in the first sub-layer.

The second layer may include a first semiconductor layer and a second sub-layer above the first semiconductor layer. The sources and drains of the third and fourth transistors may be located in the first semiconductor layer, may be separated from each other, and may be substantially parallel to each other. The gates of the third and fourth transistors may extend parallel to each other in the second sub-layer.

The third layer may include a second semiconductor layer and a third sub-layer above the second semiconductor layer. The sources and drains of the fifth and sixth transistors may be located in the second semiconductor layer, may be separated from each other, and may be substantially parallel to each other. A word line may extend across the first cell in a line between the gates of the first through fourth transistors and may include a gate of the fifth transistor and a gate of the sixth transistor.

The CMOS SRAM device may further include a plurality of bit lines extending in lines parallel to each other and crossing the word line, a first bit line of the plurality of bit lines connected to a drain of the fifth transistor and a second bit line of the plurality of bit lines connected to a drain of the sixth transistor.

The source and drain of the first transistor may be located in a main portion of a first active region of the substrate, the source and drain of the second transistor may be located in a main portion of a second active region of the substrate, the main portions of the first and second active regions of the substrate may extend parallel to each other, and each of the first and second active regions of the substrate may include protrusions located at an end of the main portion and extending perpendicular to the main portion.

The source and drain of the third transistor may be located in a first main portion of the first semiconductor layer, the source and drain of the fourth transistor may be located in a second main portion of the first semiconductor layer, and the first and second main portions of the first semiconductor layer may extend parallel to each other. The first semiconductor layer may further include a first protrusion connected to an end of the first main portion of the first semiconductor layer and extending perpendicular to the first main portion and a second protrusion connected to an end of the second main portion of the first semiconductor layer and extending perpendicular to the second main portion.

The source and drain of the fifth transistor may be located in a first main portion of the second semiconductor layer, the source and drain of the sixth transistor may be located in a second main portion of the second semiconductor layer, and the first and second main portions of the second semiconductor layer may extend parallel to each other. The second semiconductor layer may further include a first protrusion connected to an end of the first main portion of the second semiconductor layer and extending perpendicular to the first main portion, and a second protrusion connected to an end of the second main portion of the second semiconductor layer and extending perpendicular to the second main portion.

The first and second main portions of the second semiconductor layer may extend in a first direction, the first and second protrusions may extend in a second direction perpendicular to the first direction, and the sources of the first, third, and fifth transistors may be stacked one above the other in a third direction perpendicular to both the first and second directions. The drains of the second, second, fourth, and sixth transistors may be stacked one above the other in the third direction, the gates of the first and third transistors may be stacked one above the other in the third direction, and the gates of the second and fourth transistors may be stacked one above the other in the third direction.

The gates of the first through sixth transistors may include at least one of a single layer formed of polysilicon, a stack of polysilicon film layers, a metal layer, and a metal silicide layer.

The CMOS SRAM device may include a plurality of cells arranged in an array, and
a structure of one cell may mirror a structure of an adjacent cell.

Additional features and/or utilities of the present general inventive concept may be realized by a computing device including a CMOS SRAM device, the computing device including at least one cell and a controller. The cell may include a first layer including a first transistor and a second transistor, a second layer above the first layer including a third transistor and a fourth transistor, and a third layer including a fifth transistor and a sixth transistor. Each transistor of the first through sixth transistors may include a source and a drain, each extending in a first direction, and a gate extending in a second direction to cross the first direction. A gate of the fifth transistor may be connected to and linearly contiguous with a gate of the sixth transistor. The controller may control an on/off state of each of the first through sixth transistors.

The at least one cell may include a first electrical node and a second electrical node, and the controller may read data from the at least one cell by detecting a state of at least one of the first and second electrical nodes.

BRIEF DESCRIPTION OF THE DRAWINGS

Exemplary embodiments of the general inventive concept will be more clearly understood from the following detailed description taken in conjunction with the accompanying drawings in which.

DETAILED DESCRIPTION OF THE EMBODIMENTS

Figure 1:
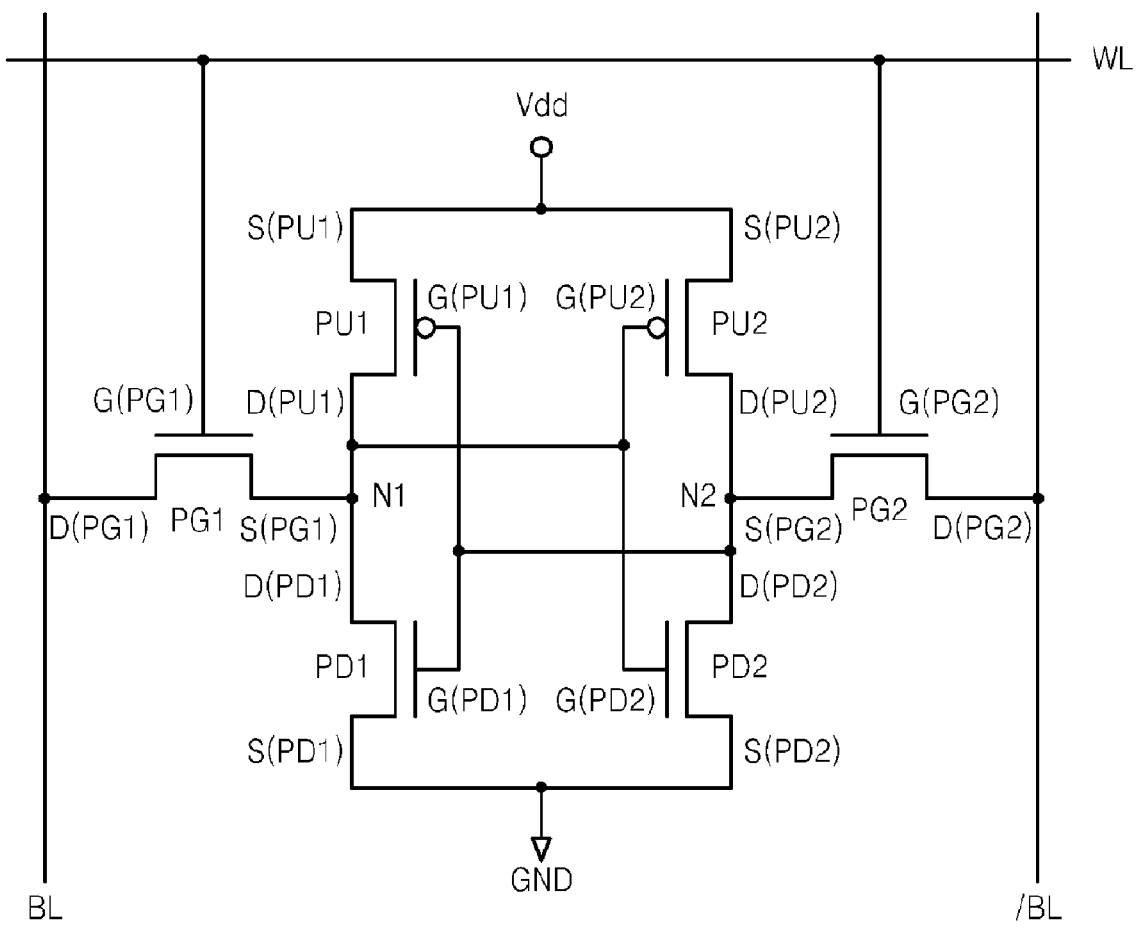
FIG. 1 is an equivalent circuit of a full complementary metal-oxide semiconductor (CMOS) static random access memory (SRAM) according to an embodiment of the inventive concept.

The inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the inventive concept to those of ordinary skill in the art. In the drawings, the thicknesses of layers and regions are exaggerated for clarity. Like reference numerals in the drawings denote like elements, and thus their description will be omitted.

FIG. 1 is an equivalent circuit of a full complementary metal-oxide semiconductor (CMOS) static random access memory (SRAM) according to an embodiment of the inventive concept. The full CMOS SRAM may include unit SRAM cells or a cell array in which unit SRAM cells are arranged in an array form.

Referring to FIG. 1, the full CMOS SRAM may include a pair of bit lines BL and/BL, a word line WL, and six transistors, for example, a pair of transmission transistors PG1 and PG2, a pair of load transistors PU1 and PU2, and a pair of driving transistors PD1 and PD2. The first and second load transistors PU1 and PU2 may be PMOS transistors, and the first and second transmission transistors PG1 and PG2 and the first and second driving transistors PD1 and PD2 may be NMOS transistors.

Gates G(PG1) and G(PG2) of the first and second transmission transistors PG1 and PG2 may be connected to the word line WL, and drains D(PG1) and D(PG2) of the first and second transmission transistors PG1 and PG2 may be respectively connected to the pair of bit lines BL and/BL. Sources S(PU1) and S(PU2) of the first and second load transistors PU1 and PU2 may be connected to a first power source line Vdd, and sources S(PD1) and S(PD2) of the first and second driving transistors PD1 and PD2 may be connected to a second power supply source line GND. The first power source line Vdd may include a power line and the second power source line GND may include a ground line.

A source S(PG1) of the first transmission transistor PG1, a drain D(PU1) of the first load transistor PU1, and a drain D(PD1) of the first driving transistor PD1 may be commonly connected to a first contact node N1. A source S(PG2) of the second transmission transistor PG2, a drain D(PU2) of the second load transistor PU2, and a drain D(PD2) of the second driving transistor PD2 may be commonly connected to a second contact node N2. A gate G(PU1) of the first load transistor PU1 and a gate G(PD1) of the first driving transistor PD1 may be commonly connected to the second contact node N2 to constitute a first latch formed of a first CMOS inverter. A gate G(PU2) of the second load transistor PU2 and a gate G(PD2) of the second driving transistor PD2 may be commonly connected to the first contact node N1 to constitute a first latch formed of a second CMOS inverter.

When the first contact node N1 is in a high level, the second load transistor PU2 is turned off and the second driving transistor PD2 is turned on, and thus, the second contact node N2 transitions to a low level. As the second contact node N2 is in a low level, the first load transistor PU1 is turned on and the first driving transistor PD1 is turned off, and thus, the first contact node N1 maintains its high level.

When the second contact node N2 is in a high level, the first load transistor PU1 is turned off and the first driving transistor PD1 is turned on, and thus, the first contact node N1 transitions to a low level. As the first contact node N1 is in a low level, the second load transistor PU2 is turned on and the second driving transistor PD2 is turned off, and thus, the second contact node N2 maintains its high level.

Therefore, when the first and second transmission transistors PG1 and PG2 are turned on based on a gate driving signal being applied to the word line WL, a data signal supplied to the first and second bit lines BL and/BL can be latched to the first and second contact nodes N1 and N2 through the first and second transmission transistors PG1 and PG2. Meanwhile, the data signal latched to the first and second contact nodes N1 and N2 is provided to the first and second bit lines BL and/BL through the first and second transmission transistors PG1 and PG2 when the first and second transmission transistors PG1 and PG2 are turned on. Thus, the data latched to the first and second contact nodes N1 and N2 may be read by sensing the data signals provided to the first and second bit lines BL and/BL through a sensing amplifier (not shown).

Figure 2A:
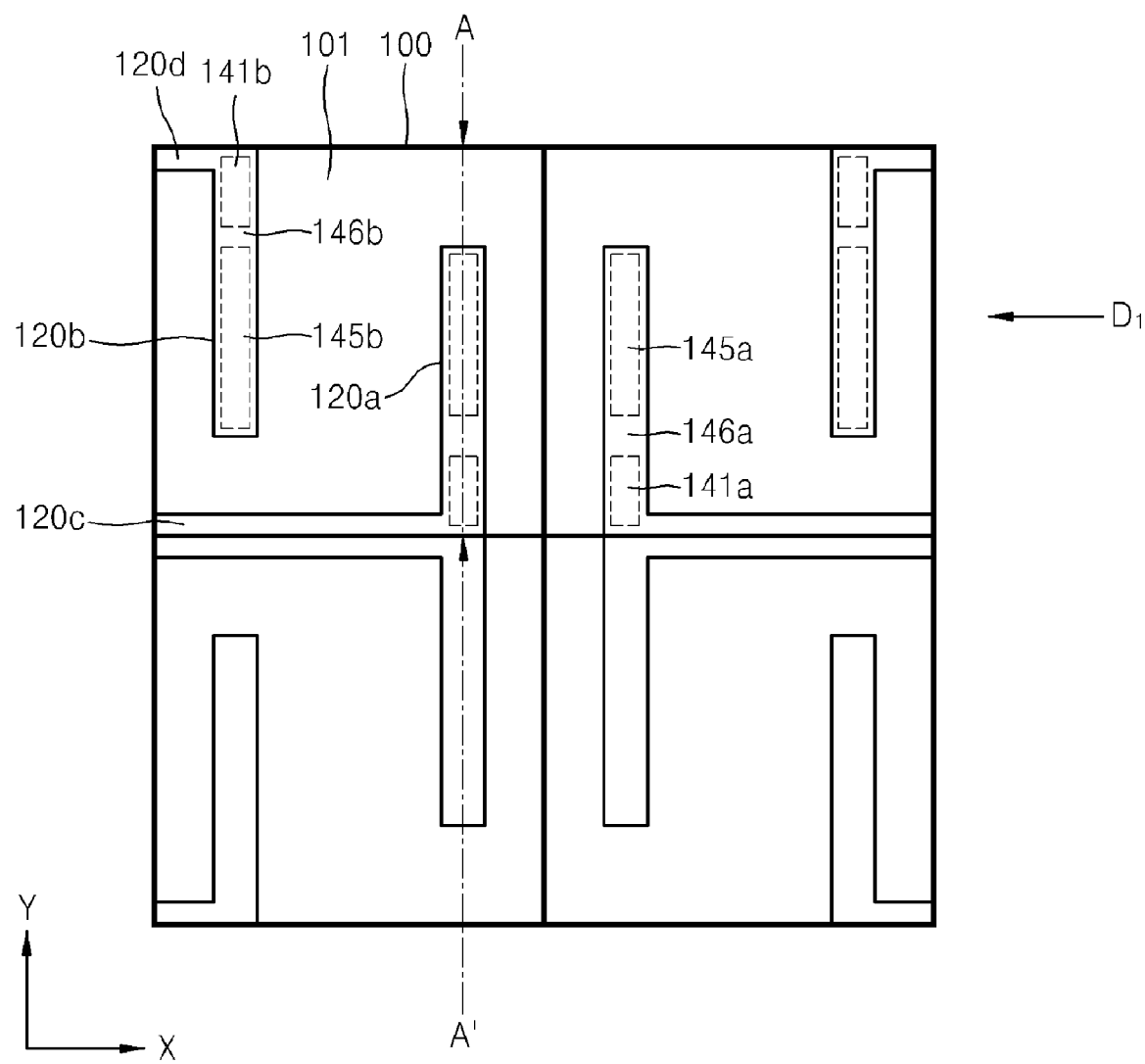
FIGS. 2A through 2J are plan views to illustrate a method of manufacturing the full CMOS SRAM of FIG. 1, according to an embodiment of the inventive concept.
Figure 2B:
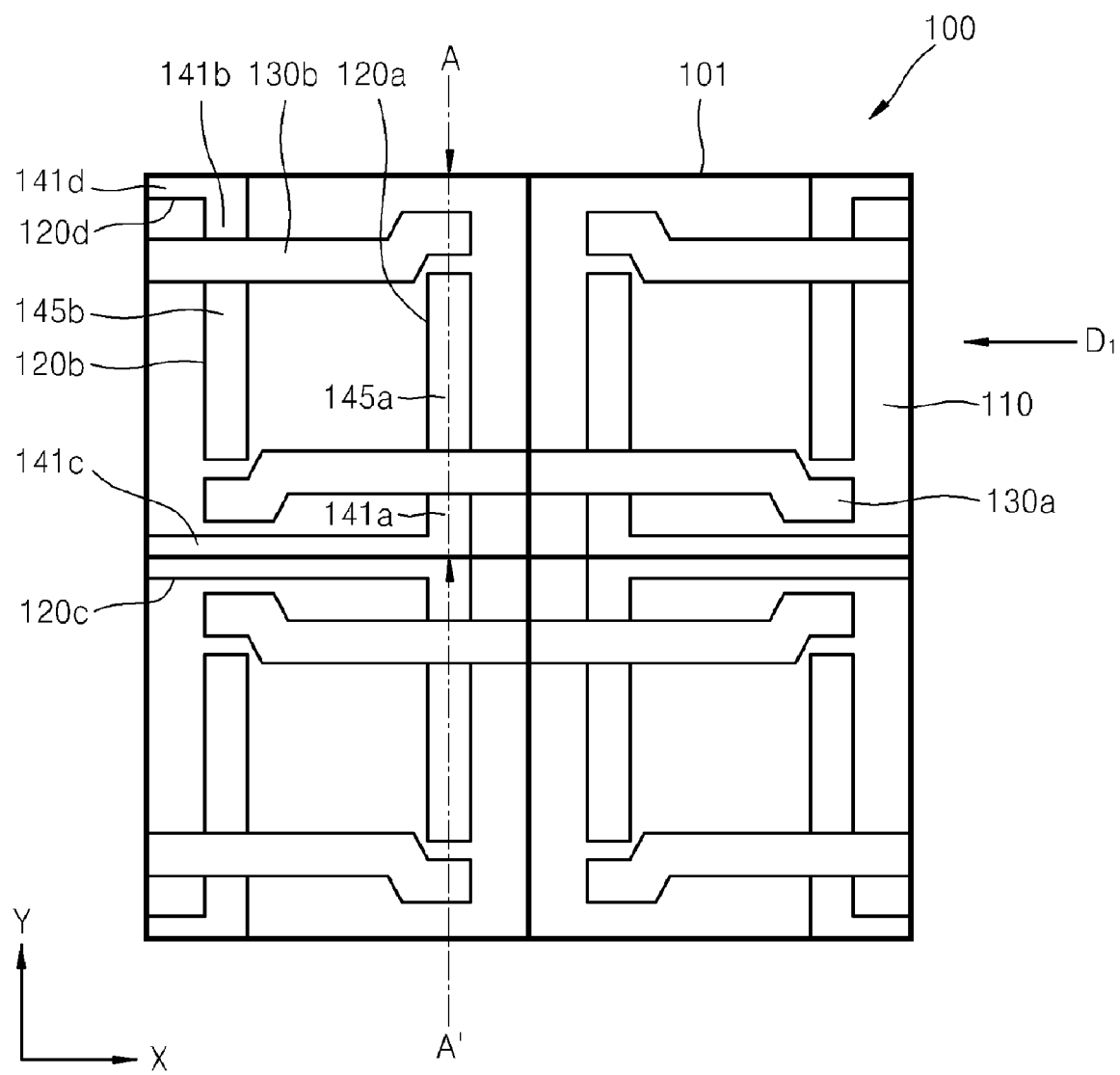

FIGS. 2A through 2J are plan views to illustrate a method of manufacturing the full CMOS SRAM of FIG. 1, according to an embodiment of the inventive concept. FIGS. 3A through 3G are cross-sectional views taken along lines A-A' of FIGS. 2A through 2G, as viewed from a direction $D_1$ to illustrate a method of manufacturing a full CMOS SRAM. FIG. 3H is a cross-sectional view taken along line B-B' and C-C' of FIG. 2H. FIG. 3I is a cross-sectional view taken along lines A-A' and G-G' of FIG. 2I to illustrate a method of manufacturing a full CMOS SRAM. FIG. 3J is a cross-sectional view taken along lines A-A' and H-H' of FIG. 2J.

Referring to FIGS. 1, 2A, 2B, 3A, and 3B, a semiconductor substrate 100 may include a plurality of cell regions 101 where SRAM cells may be arranged respectively. The cell regions 101, for example, 2×2 cell regions, may be arranged in an array in a first direction (an X direction) and a second direction (a Y direction) perpendicular to the first direction. In each of the cell regions 101 on the semiconductor substrate 100, a first active region 120a and a second active region 120b are located in the substrate, and extend substantially linearly in the second direction. The first and second active regions 120a, 120b are separated from each other in the first direction. The first and second active regions 120a and 120b may include active regions of the first and second driving transistors PD1 and PD2. The first and second active regions 120a and 120b are mirrored in cell regions 101 neighboring in the first direction and/or the second direction. The cell regions 101 may also include non-active regions 110.

The first active region 120a may include a first protrusion 120c that protrudes in the first direction. The first protrusion 120c may be arranged over an interface of two neighboring cell regions 101 in the second direction. In other words, as shown in FIG. 2A, a first protrusion 120c of a first active region 120a of a cell may be adjacent to, in direct contact with, or formed integrally with a first protrusion 120c of a first active region 120a of an adjacent cell. The second active region 120b may include a second protrusion 120d that protrudes in the first direction. The second protrusion 120d may be arranged over an interface of two neighboring cell regions 101 in the first direction.

Next, the first and second driving transistors PD1 and PD2 may be formed on the semiconductor substrate 100. A first gate 130a (G(PD1) of FIG. 1) of the first driving transistor PD1 may be arranged on the semiconductor substrate 100 to cross the first active region 120a, and a second gate 130b (G(PD2) of FIG. 1) may be arranged on the semiconductor substrate 100 to cross the second active region 120a.

The first and second gates 130a and 130b may be mirrored in the neighboring cell regions 101 in the first direction and/or the second direction. Each of the first and second gates 130a and 130b may include a gate insulating film 131 arranged on the semiconductor substrate 100, a gate electrode material 132 arranged on the gate insulating film 131, and gate spacers 133 arranged on both sides of the gate electrode material 132. The gate electrode material 132 may include a single layer formed of polysilicon or a stack layer of a polysilicon film, a metal layer, and/or a metal silicide layer.

A first source region 141a and a first drain region 145a may be formed on both sides of the first gate 130a in the first active region 120a, and a second source region 141b and a second drain region 145b may be formed on both sides of the second gate 130b in the second active region 120b. A first intermediate region 146a may be located beneath the gate 130a between the first source region 141a and the first drain region 145a, and a second intermediate region 146b may be located beneath the second gate 130b between the second source region 141b and the second drain region 145b. The intermediate region may be an un-doped region, for example.

When the first and second source regions 141a and 141b and the first and second drain regions 145a and 145b are formed, a first connection region 141c extending from the first source region 141a may be formed on the first protrusion unit 120c, and a second connection region 141d extending from the second source region 141b may be formed on the second protrusion unit 120d. The first and second connection regions 141c and 141d, the first and second source regions 141a and 141b, and the first and second drain regions 145a and 145b may be formed by implanting a highly concentrated N+ type dopant using a blanket ion injection process.

Figure 2C:
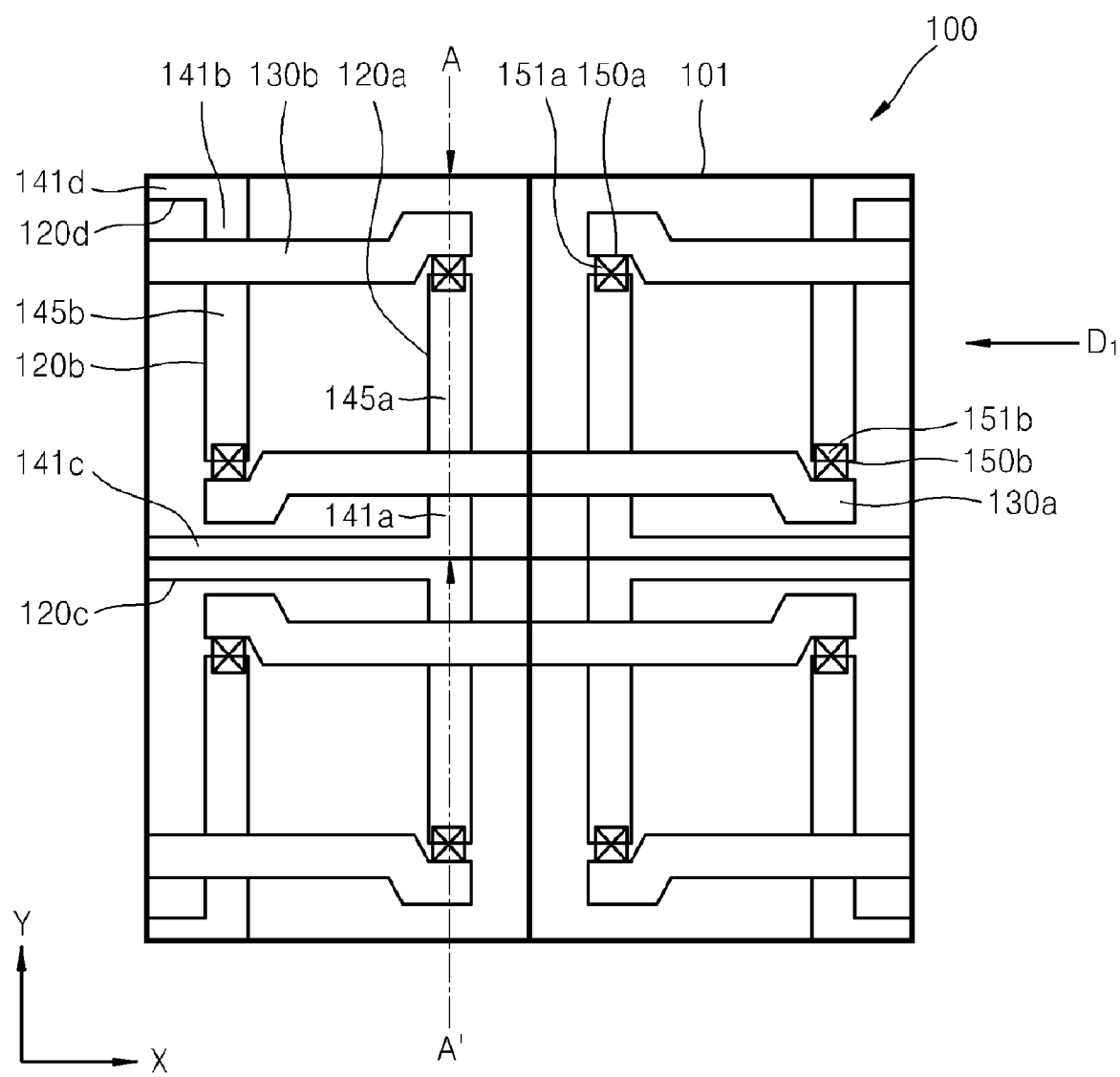
Figure 2D:
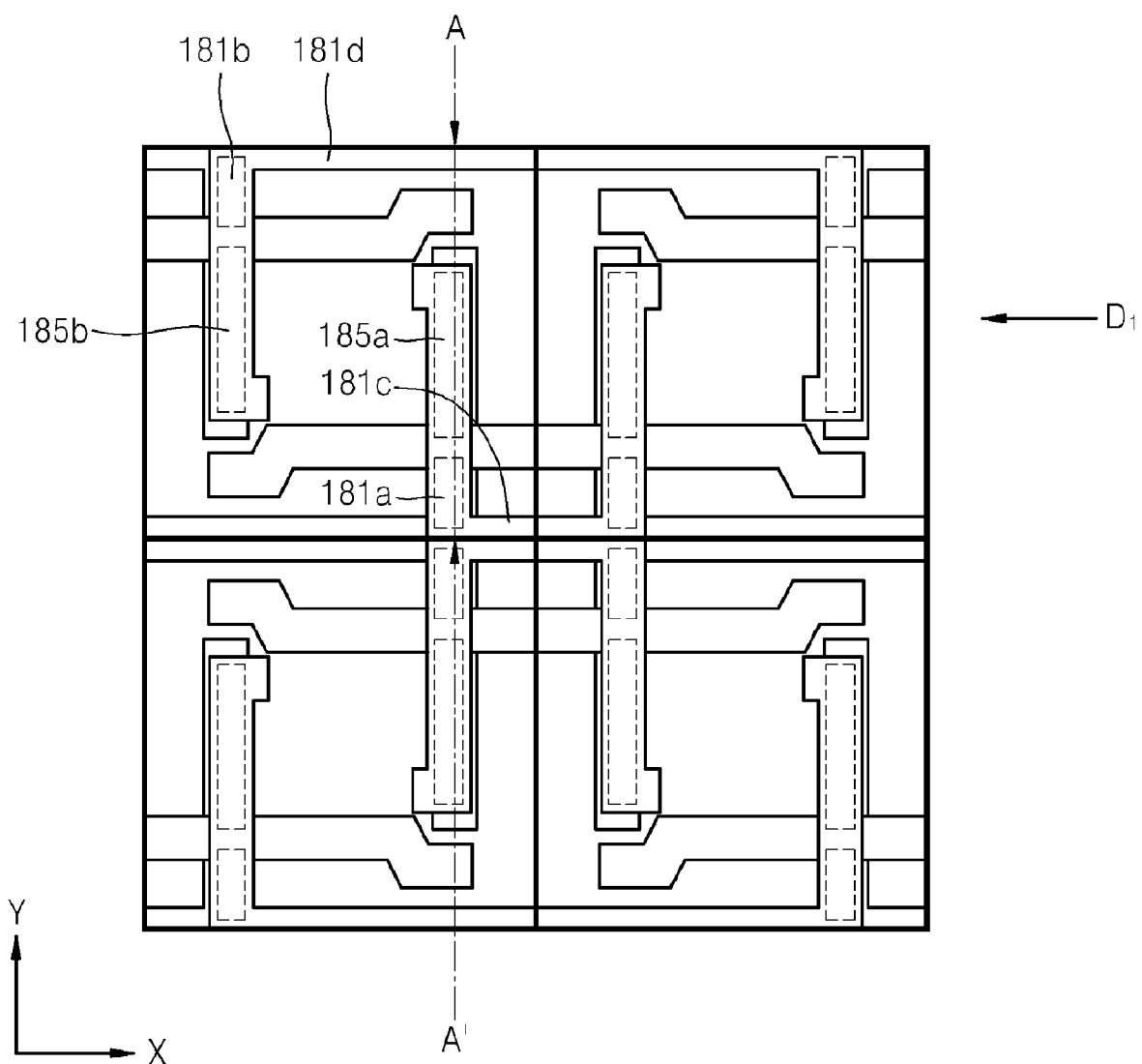
Figure 3A:
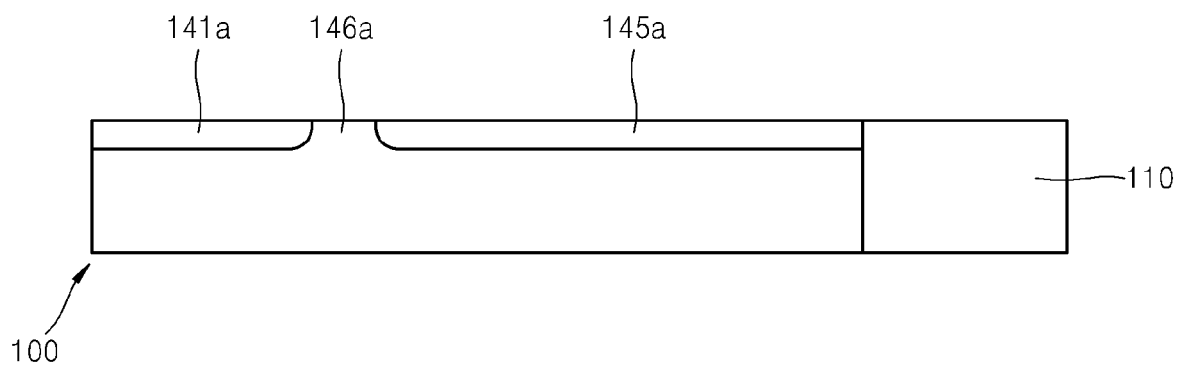
FIGS. 3A through 3J are cross-sectional views of FIGS. 2A through 2J to illustrate the method of manufacturing a full CMOS SRAM
Figure 3B:
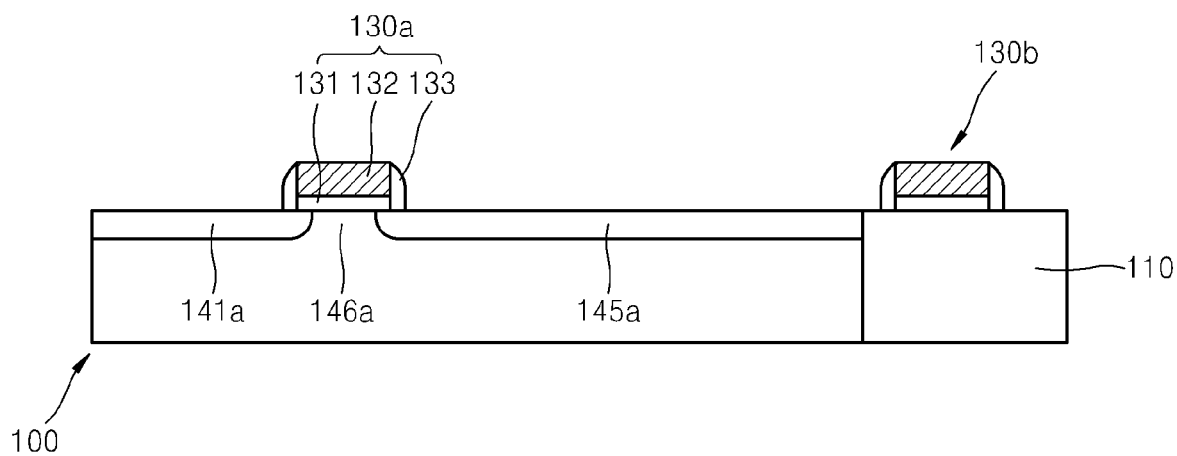
Figure 3C:
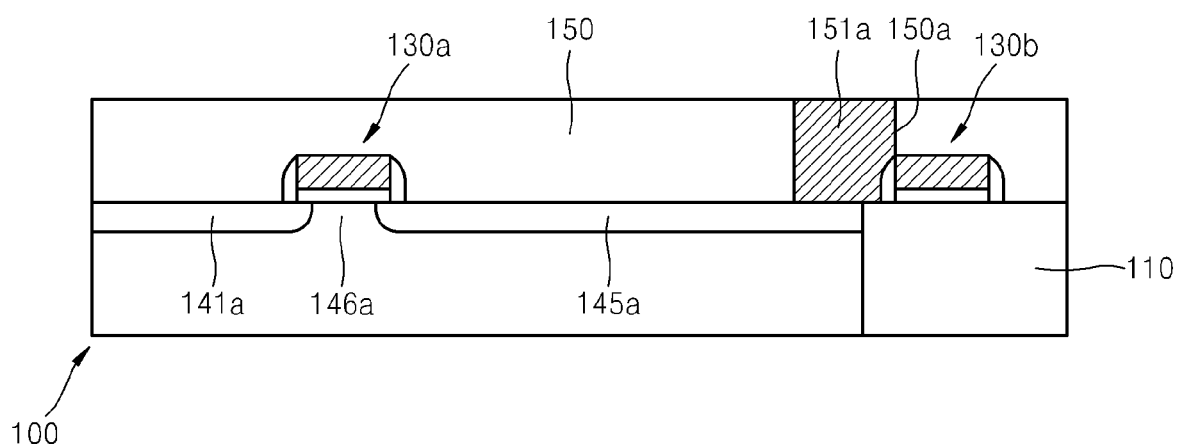
Figure 3D:
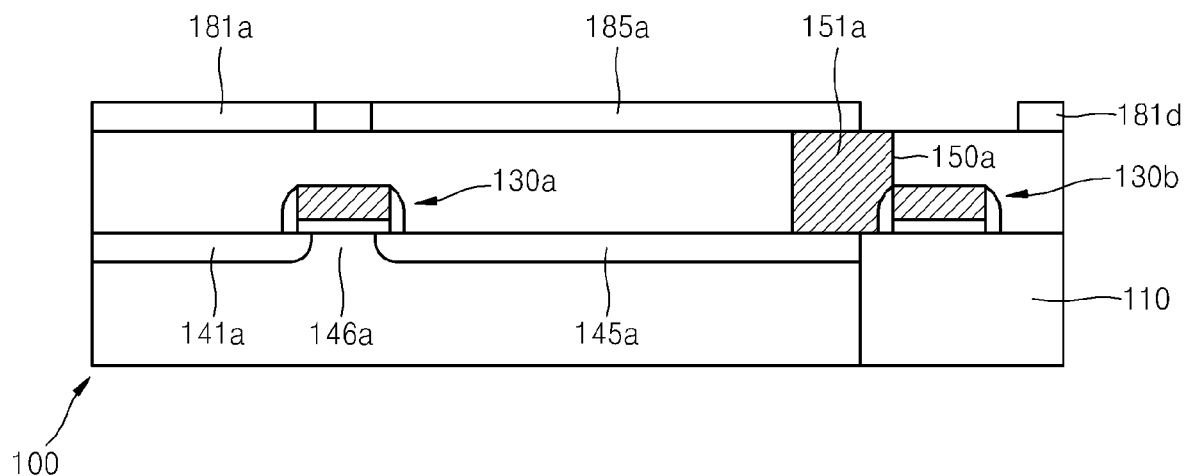
Figure 3E:
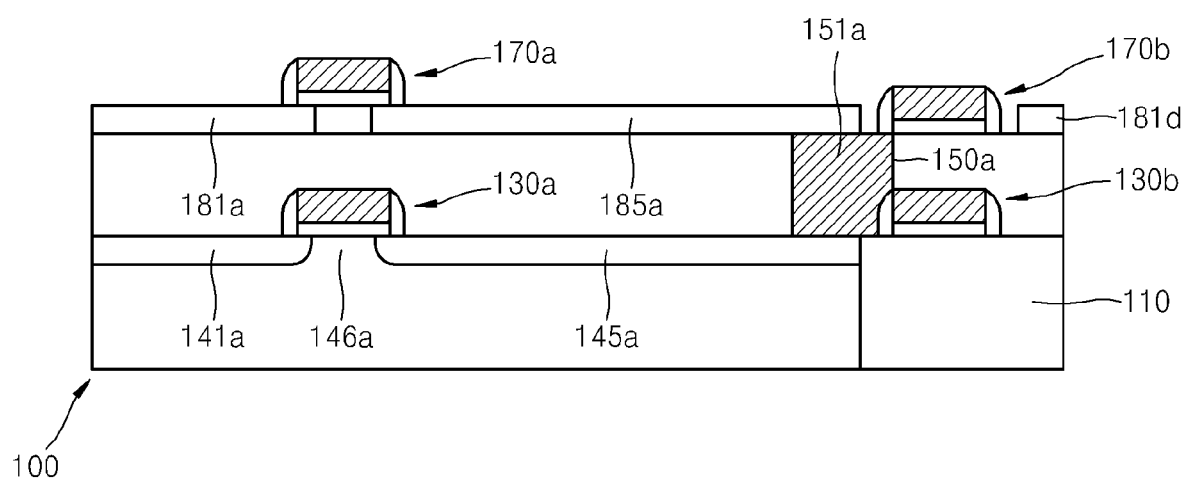

Referring to FIGS. 1, 2C and 3C, a first insulating film 150 may be formed on the semiconductor substrate 100 on which the first and second driving transistors PD1 and PD2 are arranged. The first insulating film 150 may include an interlayer insulating film. First and second contact holes 150a and 150b may be formed in the first insulating film 150 by etching the first insulating film 150. First and second contact plugs 151a and 151b may be formed in the first and second contact holes 150a and 150b. The first and second contact plugs 151a and 151b may be metal plugs or silicon plugs.

The first contact hole 150a may expose a portion of the first drain region 145a of the first driving transistor PD1 and a portion of the second gate 130b of the second driving transistor PD2. The second contact hole 150b may expose a portion of the second drain region 145b of the second driving transistor PD2 and a portion of the first gate 130a of the first driving transistor PD1. Side walls of the gate electrode material 132 may be exposed due to etching of the gate spacers 133 on side walls of the first and second gates 130a and 130b during the etching process.

Referring to FIGS. 1, 2D, 2E, 3D, and 3E, first and second semiconductor layers 160a and 160b may be formed on the first insulating film 150. The first and second semiconductor layers 160a and 160b may include active layers of the first and second load transistors PU1 and PU2. The first and second semiconductor layers 160a and 160b may include a silicon layer. The first and second semiconductor layers 160a, 160b may be located directly above the active regions 120a, 120b of the substrate in the second direction. The first and second semiconductor layers 160a and 160b may respectively include third and fourth protrusions 160c and 160d that may protrude in the first direction.

The first and second semiconductor layers 160a and 160b may be arranged to overlap the first and second active regions 120a and 120b and to cross the first and second gates 130a and 130b. The third and fourth protrusions 160c and 160d may be arranged in a direction opposite to the first and second protrusions 120c and 120d. The third and fourth protrusions 160c and 160d may be arranged in the second direction on an interface between two neighboring cell regions 101. The first and second semiconductor layers 160a and 160b may be mirrored in the neighboring cell regions 101 in the first direction and/or the second direction.

Next, the first load transistor PU1 may be formed on the first semiconductor layer 160a, and the second load transistor PU2 may be formed on the second semiconductor layer 160b. A third gate 170a overlapping the first gate 130a may be arranged on the first insulating film 150 to cross the first semiconductor layer 160a in the first direction. A fourth gate 170b overlapping the second gate 130b may be arranged on the first insulating film 150 in the first direction. The third and fourth gates 170a and 170b may be mirrored in the cell regions 101 neighboring in the first direction and/or the second direction Each of the third and fourth gates 170a and 170b may include a gate insulating film 131 formed on the first and second semiconductor layers 160a and 160b, a gate electrode material 132 formed on the gate insulating film 131, and gate spacers 133 arranged on both sides of the gate electrode material 132. The gate electrode 132 may include a single layer formed of polysilicon or a stack layer of a polysilicon film, a metal layer, and/or a metal silicide layer.

A third source region 181a and a third drain region 185a of the first load transistor PU1 may be formed in the first semiconductor layer 160a on both sides of the third gate 170a. A fourth source region 181b and a fourth drain region 185b of the second load transistor PU2 may be formed in the second semiconductor layer 160b on both sides of the fourth gate 170b. The third and fourth source and drain regions 181a, 181b, 185a, 185b may be formed in the semiconductor layers 160a, 160b either before or after the gates 170a, 170b or formed on the semiconductor layers 160a, 160b. The third drain region 185a of the first load transistor PU1 may be electrically connected to the first drain region 145a of the first driving transistor PD1 through the first contact plug 151a. The fourth drain region 185b of the second load transistor PU2 may be electrically connected to the second drain region 145b of the second driving transistor PD2 through the second contact plug 151b. Portions of the first and second semiconductor layers 160a and 160b between the third and fourth source regions 181a and 181b and the third and fourth drain regions 185a and 185b may function as channel regions of the first and second load transistors PU1 and PU2.

Figure 2E:
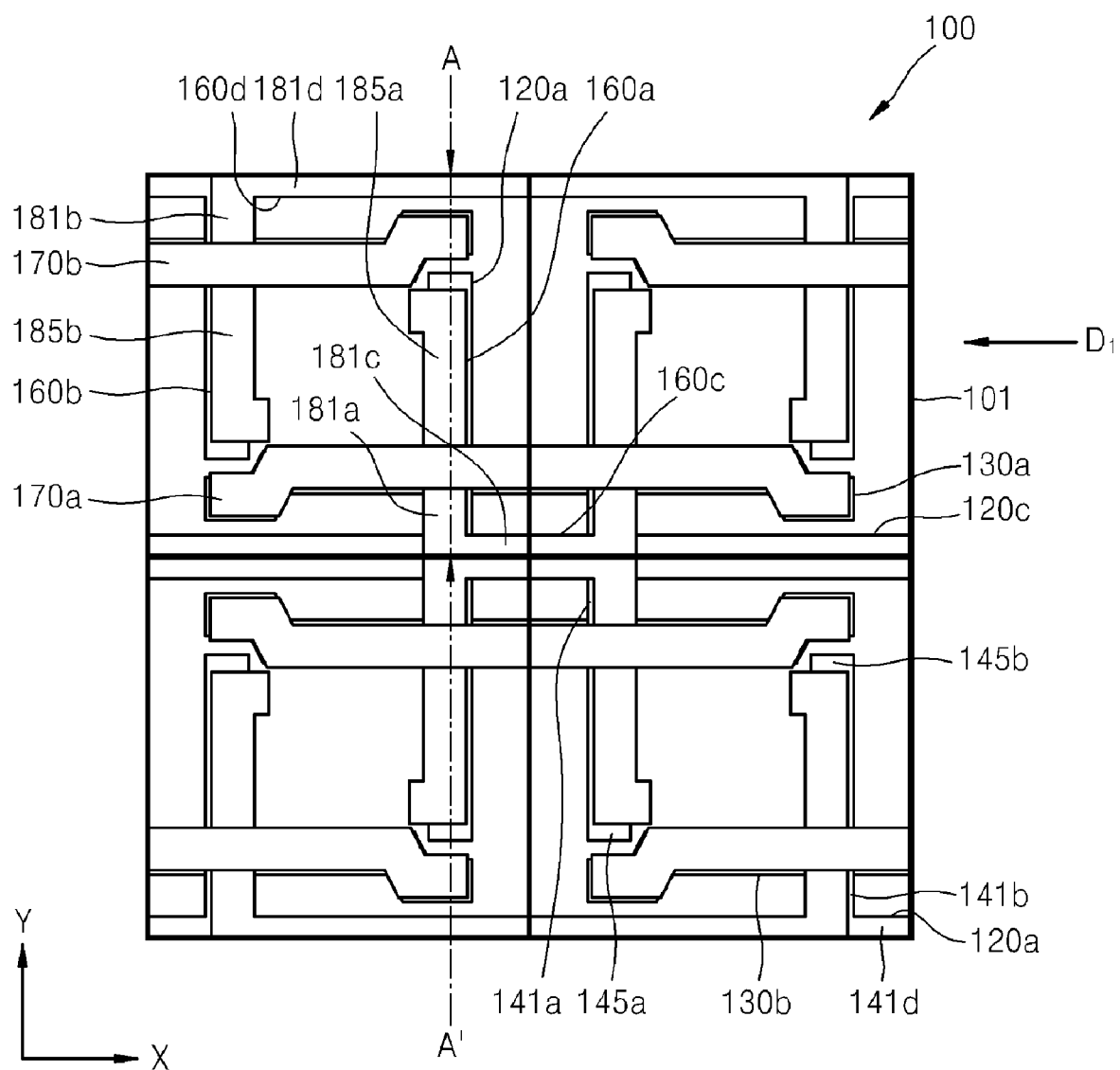

When the third and fourth source regions 181a and 181b and the third and fourth drain regions 185a and 185b are formed, a third connection region 181c extending from the third source region 181a may be formed on the third protrusion 160c, and a fourth connection region 181d extending from the fourth source region 181b may be formed on the fourth protrusion 160d. The third and fourth connection regions 181c and 181d, the third and fourth source regions 181a and 181b, and the third and fourth drain regions 185a and 185b may be formed by implanting a highly concentrated P+ type dopant using a blanket ion injection process. When a plurality of cells 101 are arranged in an array, the third and fourth connection regions 181c and 181d may extend toward a center line between two adjacent cells 101 and may be contiguous with third and fourth connection regions 181c and 181d of the adjacent cell. The third and fourth connection regions 181c and 181d may also be contiguous with respective connection regions of an adjacent cell in a direction perpendicular to the direction in which the connection regions extend. For example, as shown in FIG. 2E, the third connection region 181c extends in a first direction X and is contiguous with a corresponding connection region in the adjacent cell in the direction X. However, the third connection region 181c is also contiguous with a connection region in the cell adjacent in the direction Y, perpendicular to the direction X.

Figure 2F:
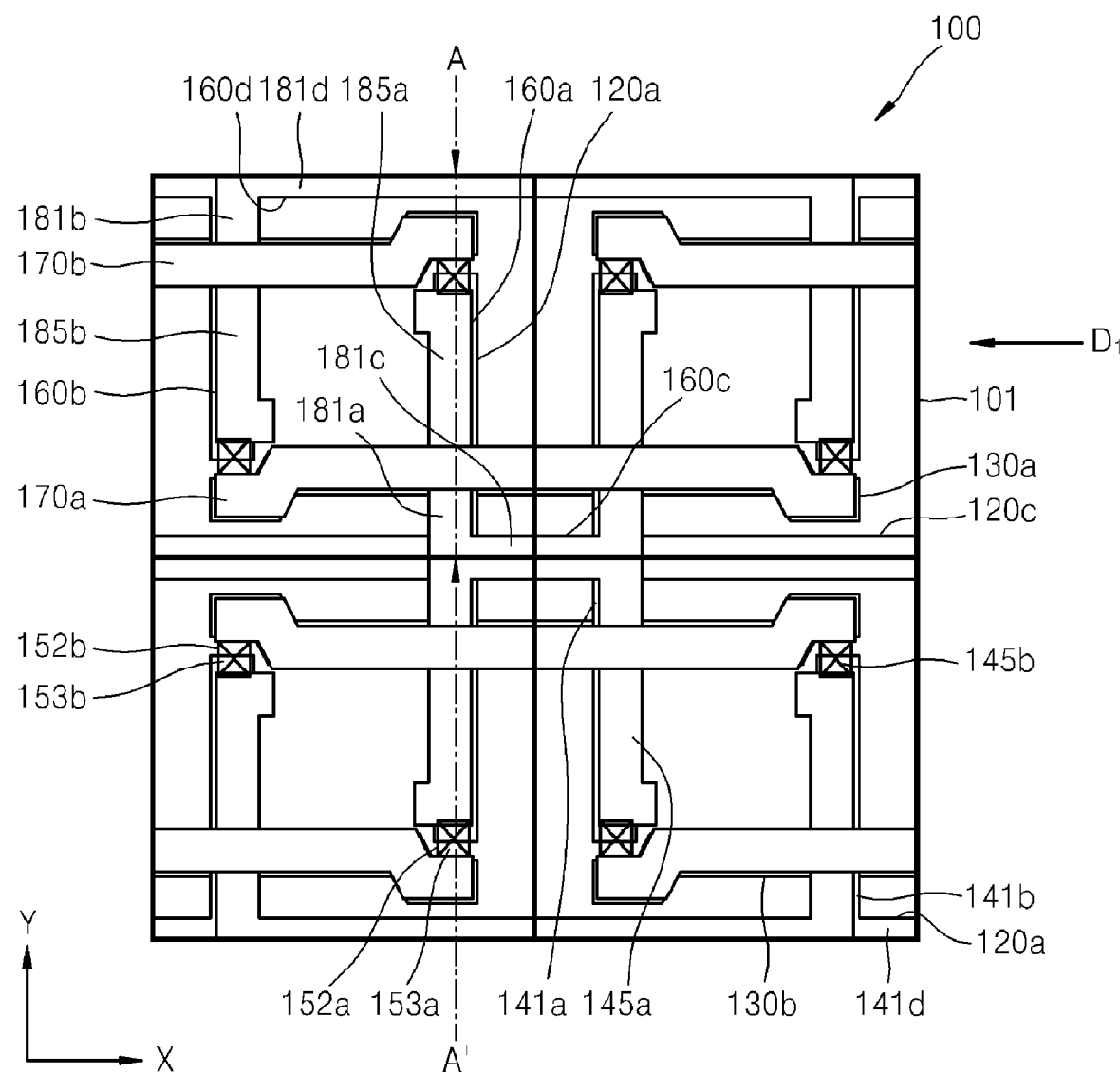
Figure 3F:
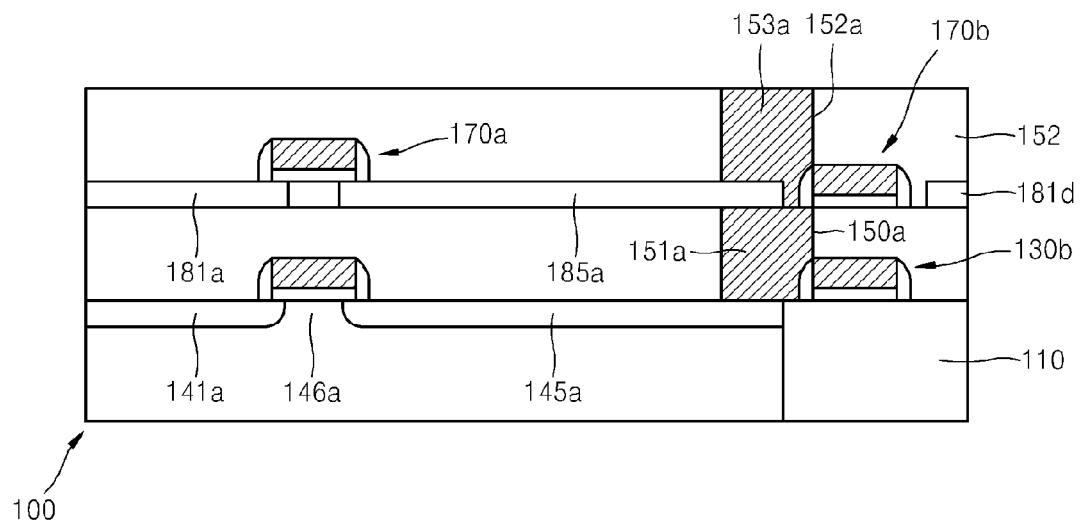

Referring to FIGS. 1, 2F, and 3F, a second insulating film 152 may be formed on the first insulating film 150 and on the first and second semiconductor layers 160a and 160b, on which the first and second load transistors PU1 and PU2 are arranged. The second insulating film 152 may include an interlayer insulating layer. Third and fourth contact holes 152a and 152b may be formed in the second insulating film 152 by etching the second insulating film 152. Third and fourth contact plugs 153a and 153b may be formed in the third and fourth contact holes 152a and 152b. The third and fourth contact plugs 153a and 153b may be metal plugs or silicon plugs The third contact hole 152a may expose a portion of the third drain region 185a of the first load transistor PU1 and a portion of the fourth gate 170b of the second load transistor PU2. The fourth contact hole 152b may expose a portion of the fourth drain region 185 of the second load transistor PU2 and a portion of the third gate 170a of the first load transistor PU1. Side walls of the gate electrode material 172 may be exposed due to etching of the gate spacers 173 on side walls of the third and fourth gates 170a and 170b during the etching process.

According to an embodiment of the inventive concept, instead of separately performing the etching process of the first and second insulating films 150, 152 and the forming process of the first through fourth contact plugs 151a, 151b, 153a, 153b of FIGS. 3C and 3F, through holes and contact plugs may be formed in a single process. For example, referring to FIG. 3F, after the insulation layers 150, 152 are formed, holes may be formed through the insulation layers 150, 152 to expose portions of the first and second drain regions 145a and 145b and the first and second gates 130a and 130b of the first and second driving transistors PD1 and PD2 and portions of the third and fourth drain regions 185a and 185b and the third and fourth gates 170a and 170b of the first and second load transistors PU1 and PU2, and contact plugs may be formed in the through holes.

Figure 2G:
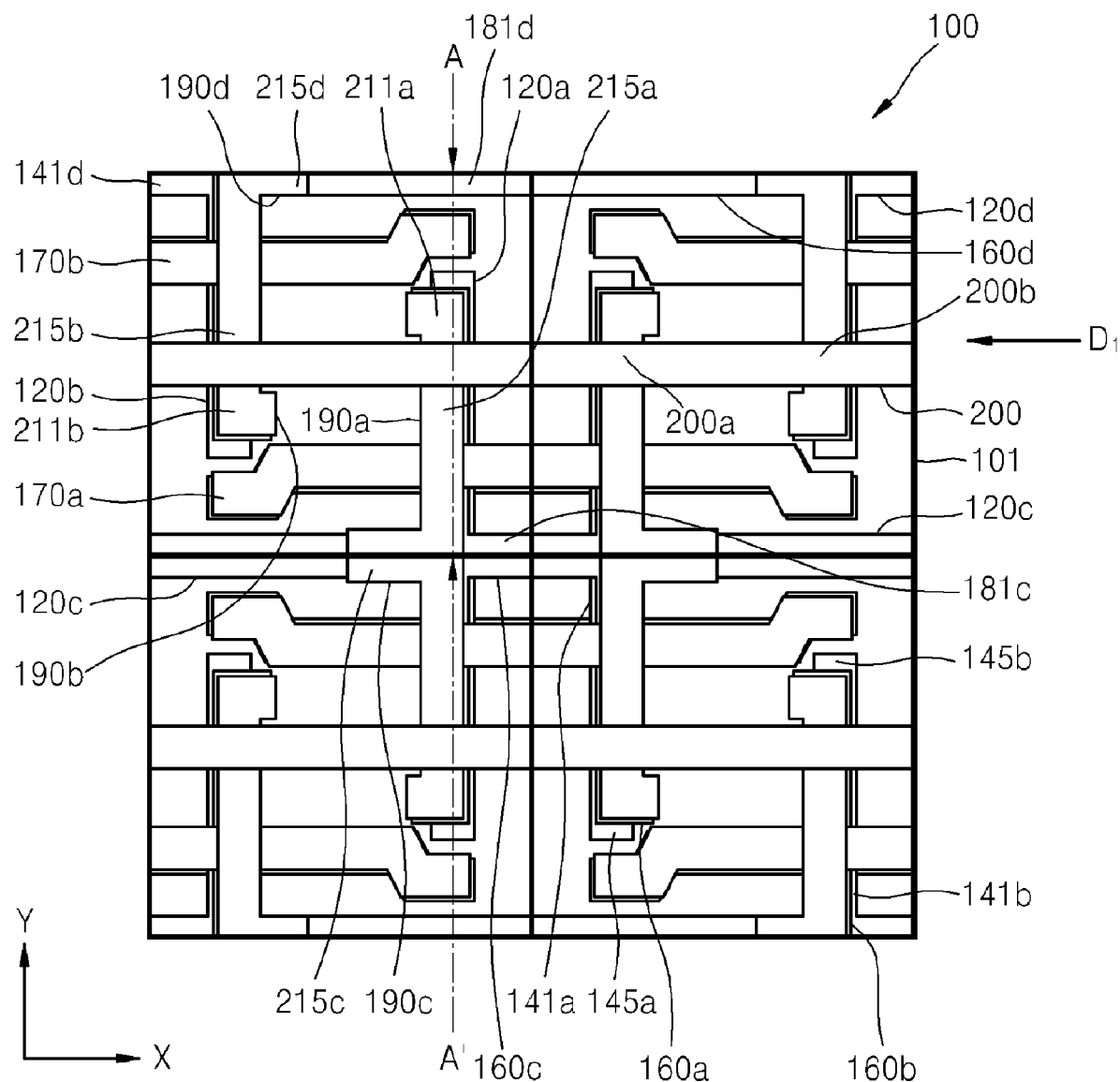
Figure 3G:
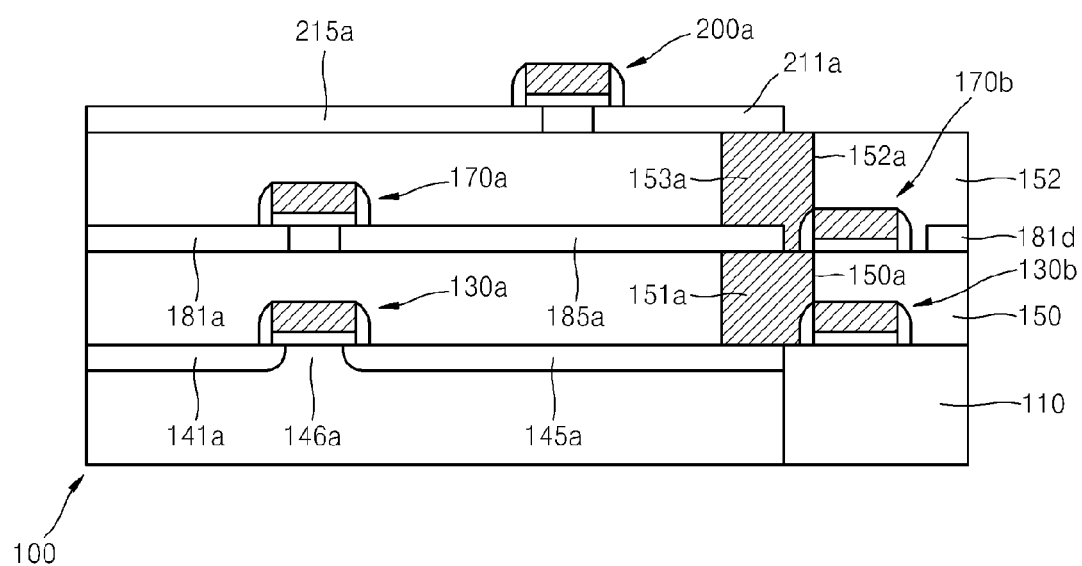
Figure 3H:
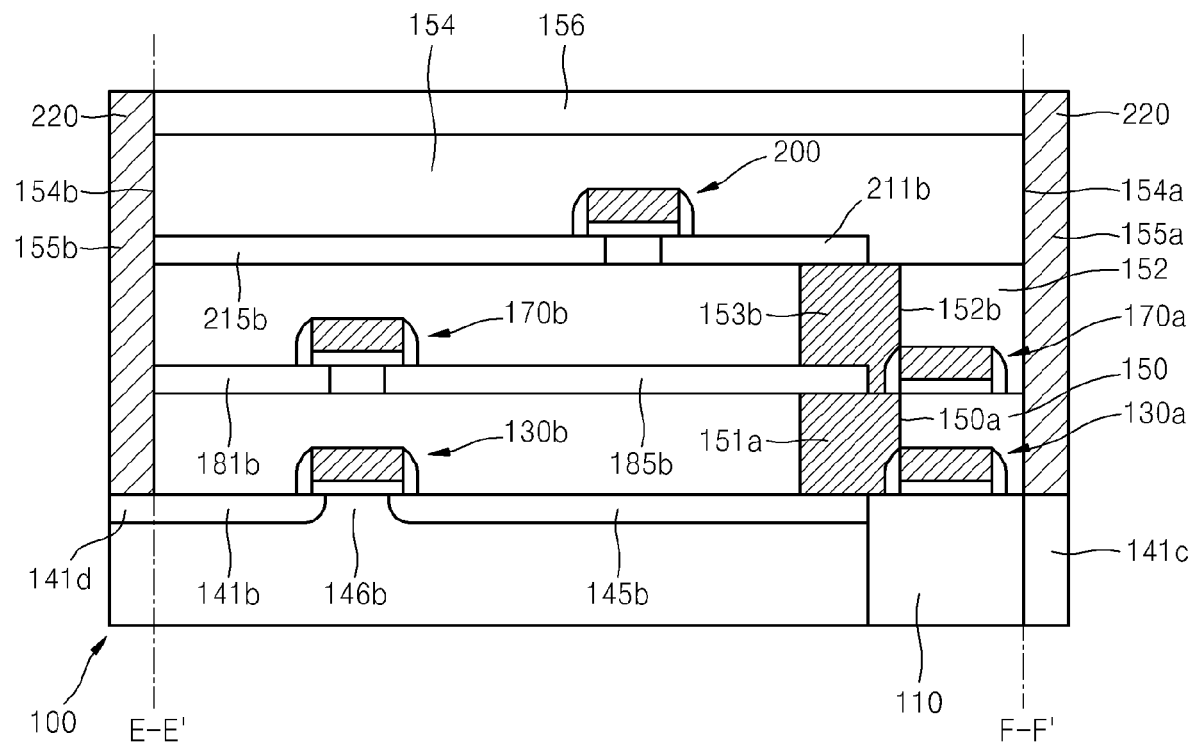
Figure 3I:
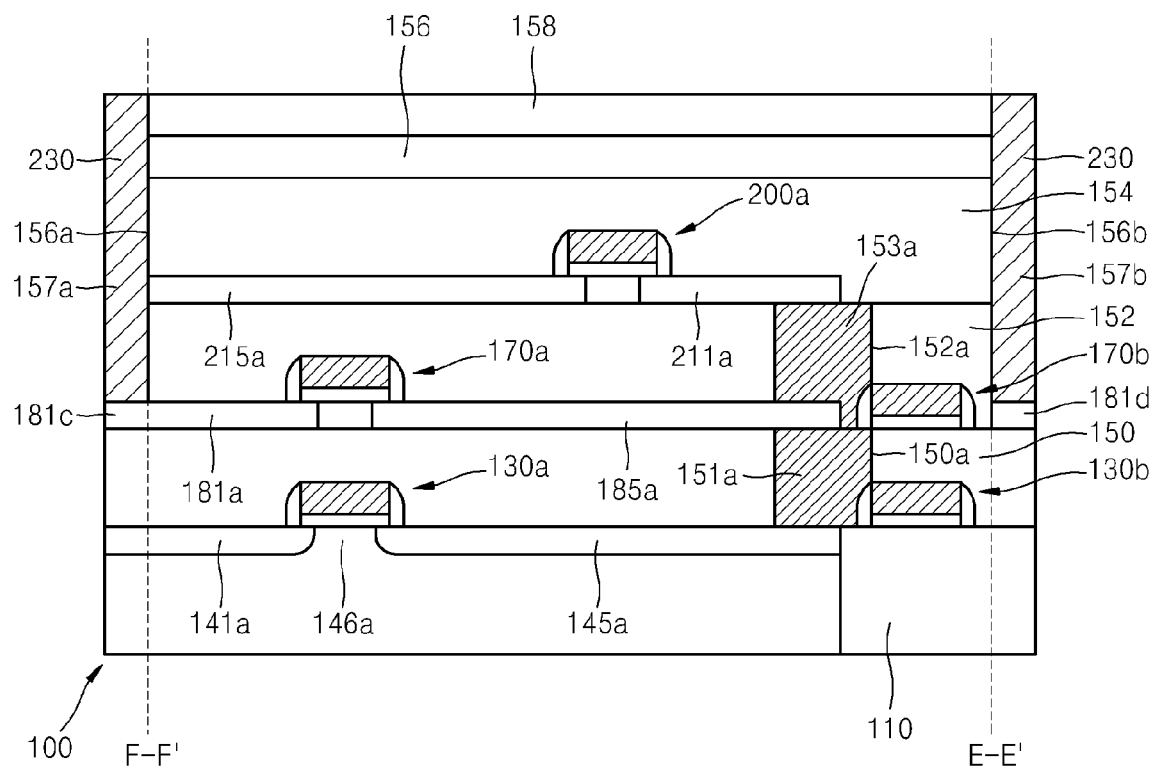
Figure 3J:
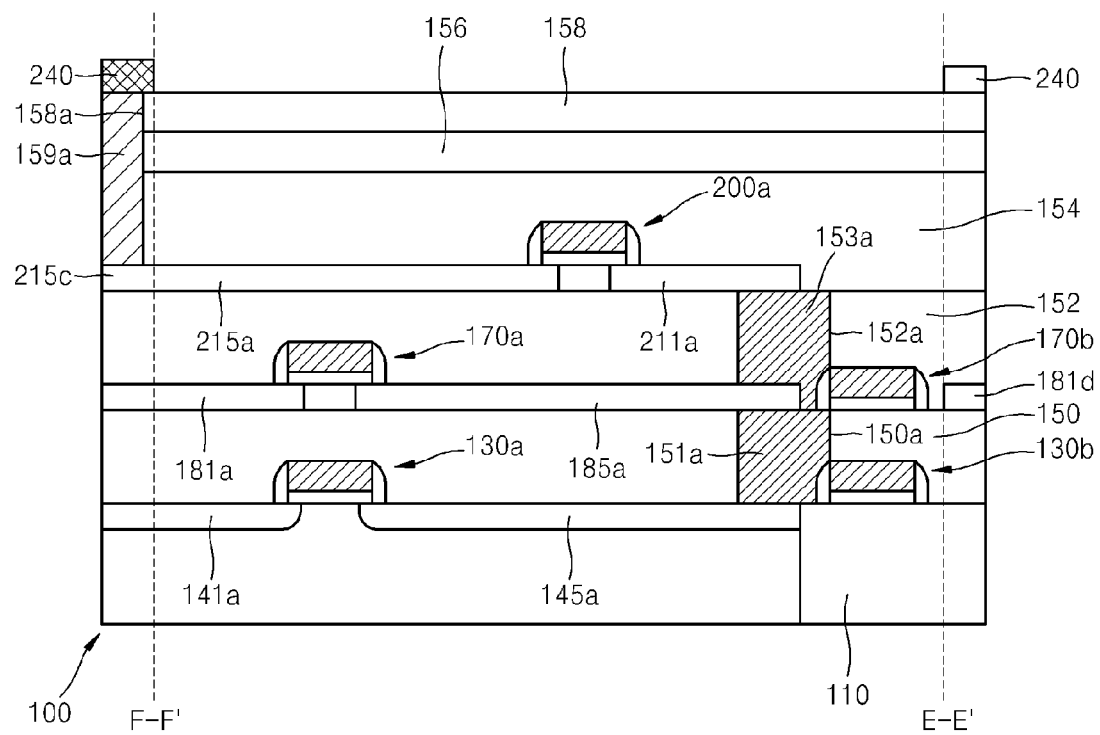

Referring to FIGS. 1, 2G, and 3G, third and fourth semiconductor layers 190a and 190b may be formed on the second insulating film 152. The third and fourth semiconductor layers 190a and 190b may include silicon layers. The third and fourth semiconductor layers 190a and 190b may include active layers of the first and second transmission transistors PG1 and PG2. The third and fourth semiconductor layers 190a and 190b may include fifth and sixth protrusions 190c and 190d protruding in the first direction. The fifth and sixth protrusions 190c and 190d may be arranged in the same direction as the first and fourth protrusion units 120c and 160d respectively. The fifth and sixth protrusions 190c and 190d may be arranged on an interface between two cell regions 101 neighboring in the second direction. The third and fourth semiconductor layers 190a and 190b may be mirrored in the cell regions 101 neighboring in the first direction X and/or the second direction Y.

Next, the first transmission transistor PG1 may be formed on the third semiconductor layer 190a, and the second transmission transistor PG2 may be formed on the fourth semiconductor layer 190b. A word line 200 crossing the third and fourth semiconductor layers 190a and 190b is formed on the second insulating film 152. The word line 200 is arranged in a straight line in the first direction between the third and fourth gates 170a and 170b or between the first and second gates 130a and 130b so as not to overlap the third and fourth gates 170a and 170b and/or the first and second gates 130a and 130b.

The word lines 200 may be arranged in parallel to the word lines 200 of the cell regions 101 neighboring in the second direction Y, and may be arranged in a straight line in the first direction across the cell regions 101 neighboring in the first direction X. A first portion 200a of the word line 200 that overlaps the third semiconductor layer 190a may include the fifth gate G(PG1) of the first transmission transistor PG1 and a second portion 200b of the word line 200 that overlaps the fourth semiconductor layer 190b may include the sixth gate G(PG2) of the second transmission transistor PG2. The word line 200 may be mirrored in the cell regions 101 neighboring in the first direction and/or the second direction.

The word line 200 may include a gate insulating film 131 formed on the third and fourth semiconductor layers 190a and 190b, a gate electrode material 132 formed on the gate insulating film 201, and gate spacers 133 arranged on both side walls of the gate electrode material 202. The gate electrode material 202 may include a single layer formed of polysilicon or a stack layer of a polysilicon film, a metal layer, and/or a metal silicide layer.

A fifth source region 211a and a fifth drain region 215a of the first transmission transistor PG1 may be arranged in the third semiconductor layer 190a on both sides of the fifth gate 200a. A sixth source region 211b and a sixth drain region 215b of the second transmission transistor PG2 may be arranged in the fourth semiconductor layer 190b on both sides of the sixth gate 200b. The fifth source region 211a of the first transmission transistor PG1 may be electrically connected to the first drain region 145a of the first driving transistor PD1, the third drain region 185a of the first load transistor PU1, the second gate 130b of the second driving transistor PD2, and the fourth gate 170b of the second load transistor PU2 through the first and third contact plugs 151a and 153a.

The sixth source region 211b of the second transmission transistor PG2 may be electrically connected to the second drain region 145b of the second driving transistor PD2, the fourth drain region 185b of the second load transistor PU2, the first gate 130a of the first driving transistor PD1, and the third gate 170a of the first load transistor PU1 through the second and fourth contact plugs 151b and 153b. Portions of the third and fourth semiconductor layers 190a and 190b between the fifth and sixth source regions 211a and 211b and the fifth and sixth drain regions 215a and 215b may function as channel regions of the first and second transmission transistors PG1 and PG2.

When the fifth and sixth source regions 211a and 211b and the fifth and sixth drain regions 215a and 215b are formed, a fifth connection region 215c extending from the fifth drain region 215a may be formed on the fifth protrusion 190c, and a sixth connection region 215d extending from the sixth drain region 215b may be formed on the sixth protrusion 190d. The fifth and sixth connection regions 215c and 215d, the fifth and sixth source regions 211a and 211b, and the fifth and sixth drain regions 215a and 215b may be formed by implanting a highly concentrated N+ type dopant into them using a blanket ion injection process.

Figure 2H:
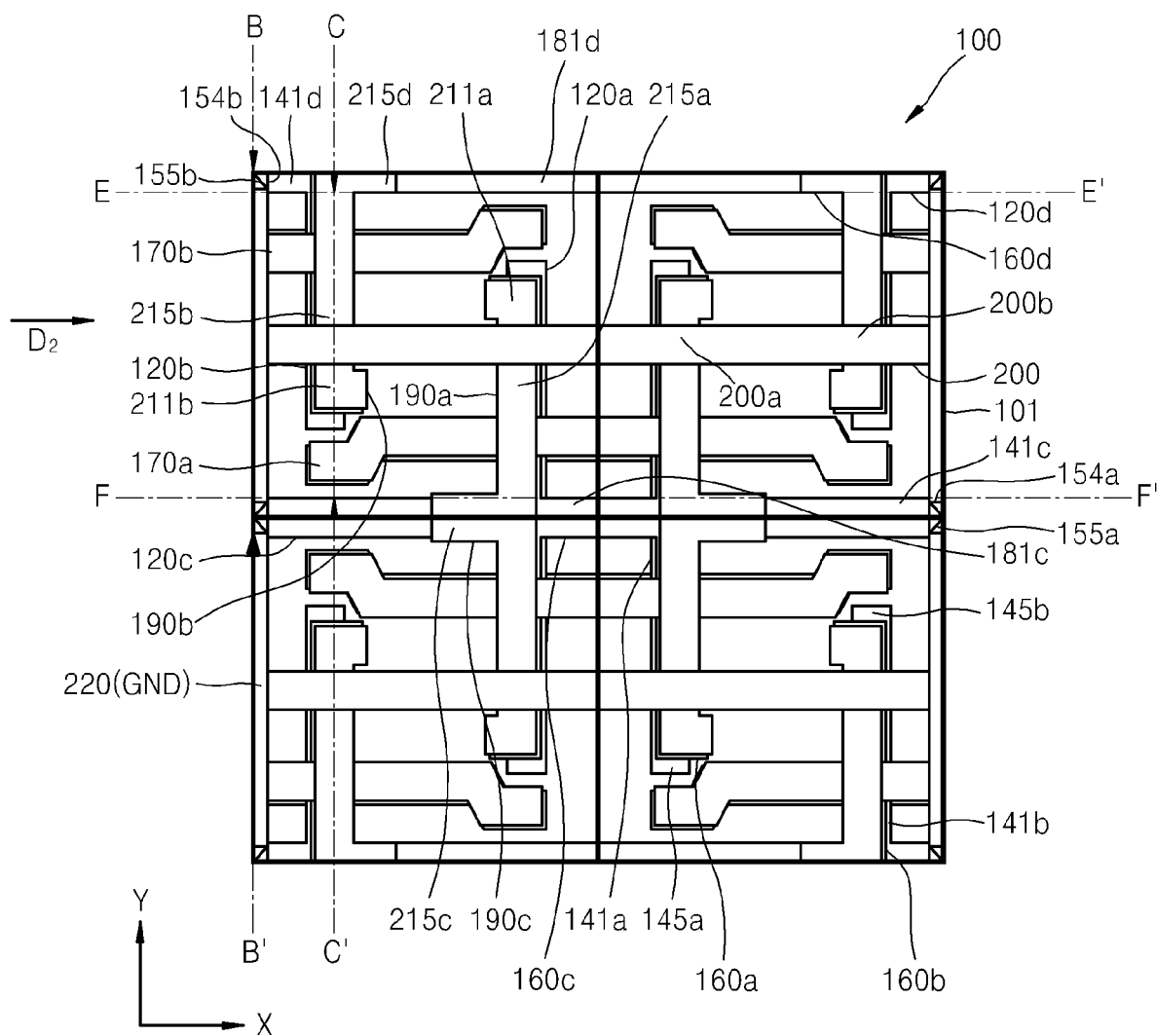

Referring to FIGS. 1, 2H, and 3H, FIG. 3H is a cross-section taken along a plane defined by line B-B' between an end of the cell and lines E-E' and F-F', and taken along a plane defined by line C-C' between lines E-E' and F-F', and as seen from a direction $D_2$. The cell 101 is so shown to illustrate a geographic relationship between the second power (or ground) lines 220 and the other elements of the cell 101. A third insulating film 154 may be formed on the second insulating film 152 and the third and fourth semiconductor layers 190a and 190b on which the first and second transmission transistors PG1 and PG2 are formed. The third insulating film 154 may include an interlayer insulating layer. A fifth contact hole 154a may be formed to expose a portion of the first connection region 141c arranged on the first protrusion unit 120c, and a sixth contact hole 154b may be formed to expose a portion of the second connection region 141d arranged on the second protrusion unit 120d. The contact holes 154a, 154b may be formed by etching the third insulating film 154, for example. The fifth and sixth contact holes 154a and 154b may be formed to expose portions of the first and second connection regions 141c and 141d arranged on the four cell regions 101 neighboring in the first direction and the second direction.

Next, fifth and sixth contact plugs 155a and 155b may be formed in the fifth and sixth contact holes 154a and 154b respectively. The fifth and sixth contact plugs 155a and 155b may be silicon plugs or metal plugs. A second power source line 220 connected to the fifth and sixth contact plugs 155a and 155b may be formed. The second power source line 220 may include a metal line. The second power source line 220 may be electrically connected to the first and second source regions 141a and 141b of the first and second driving transistors PD1 and PD2 in the four cell regions 101 through the first and second connection regions 141c and 141d arranged on the four neighboring cell regions 101.

Figure 2I:
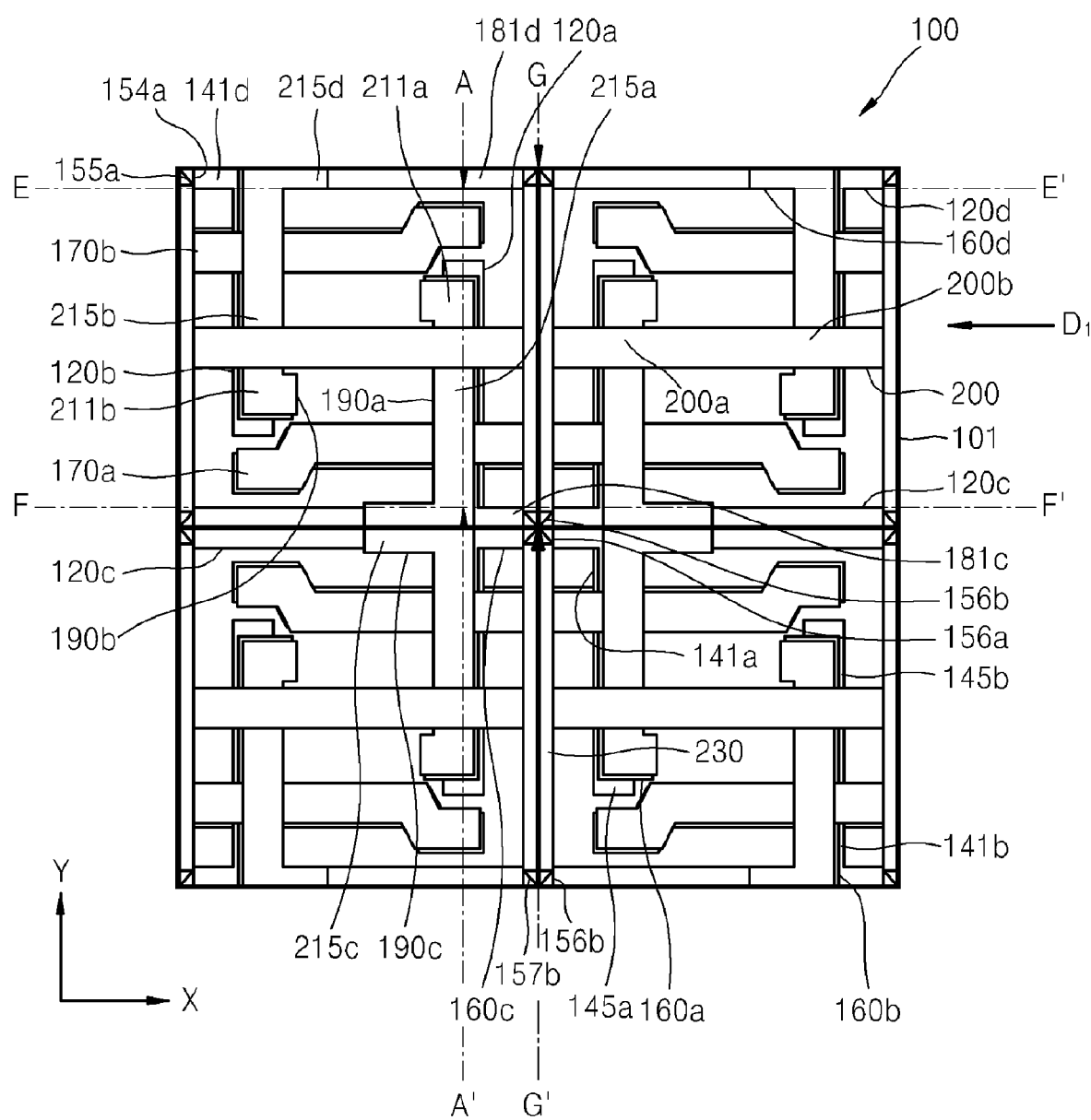

Referring to FIGS. 1, 2I, and 3I, FIG. 3I is a cross-section as seen from a direction $D_1$ of the cell as intersected along line G-G' between an end of the cell and lines E-E' and F-F', and along a plane defined by line A-A' between lines E-E' and F-F'. The cell 101 is so shown to illustrate a geographic relationship between the first power line 230 and the other elements of the cell 101. A fourth insulating film 156 may be formed on the second power source line 220 and the third insulating film 154. The fourth insulating film 156 may include an interlayer insulating layer. Seventh and eighth contact holes 156a and 156b may be formed in the fourth insulating film 156 by etching the fourth insulating film 156. The seventh and eighth contact holes 156a and 156b may expose portions of the third and fourth connection regions 181c and 181d which are extended from the third and fourth source regions 181a and 181b of the first and second load transistors PU1 and PU2. The seventh and eighth contact holes 156a and 156b may be formed to expose portions of the third and fourth connection regions 181c and 181d arranged on the four cell regions 101 neighboring in the first direction and the second direction.

Seventh and eighth contact plugs 157a and 157b may be formed in the seventh and eighth contact holes 156a and 156b respectively. The seventh and eighth contact plugs 157a and 157b may be silicon plugs or metal plugs. A first power source line 230 that is electrically connected to the seventh and eighth contact plugs 157a and 157b may be formed on the fourth insulating film 156. The first power source line 230 may include a metal line. The first power source line 230 may be electrically connected to the third and fourth source regions 181a and 181b of the first and second load transistors PU1 and PU2 in the four cell regions 101 through the third and fourth connection regions 181c and 181d arranged in the four neighboring cell regions 101.

Figure 2J:
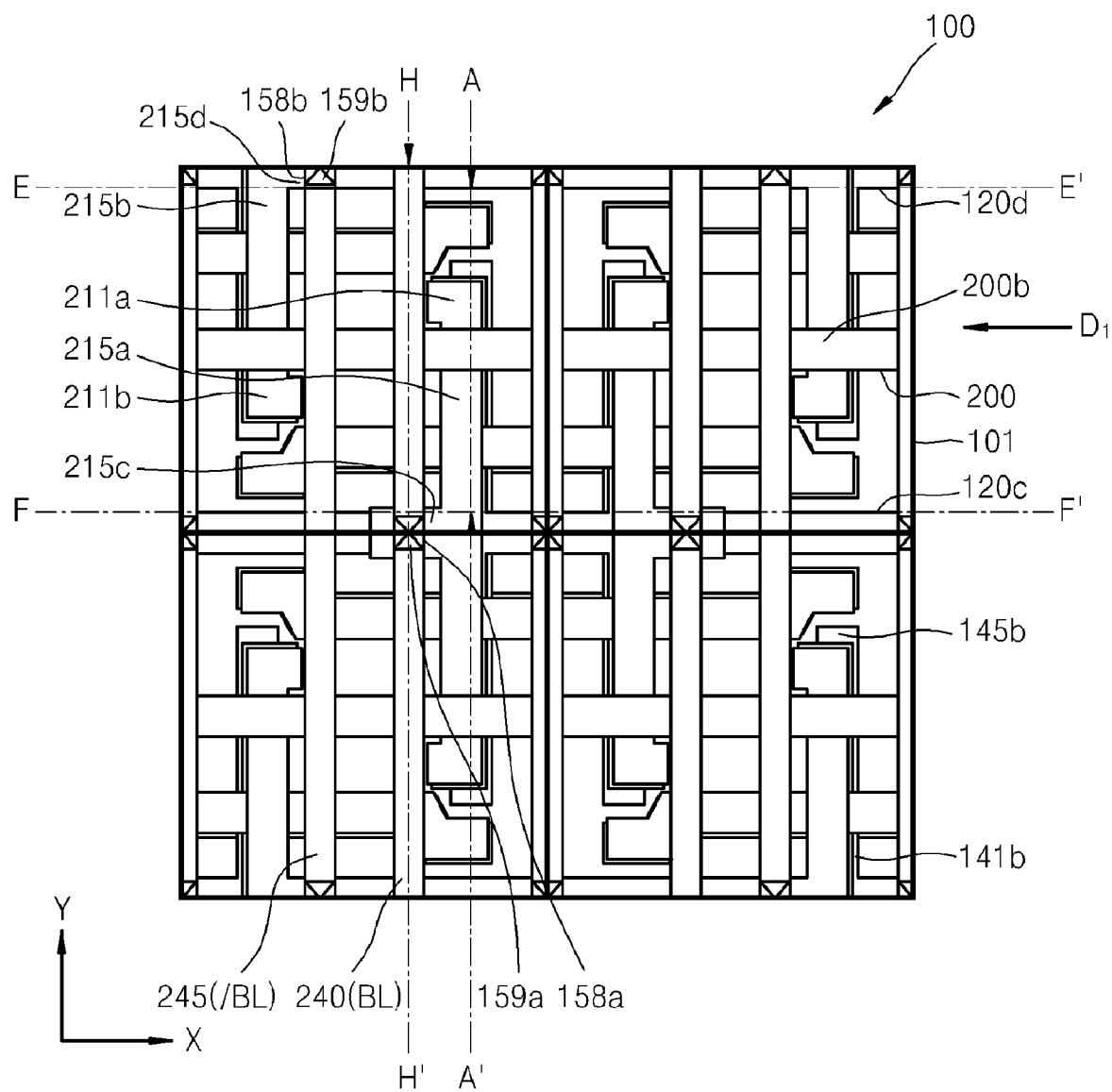

Referring to FIGS. 1, 2J, and 3J, FIG. 3J is a cross-section taken along a plane defined by line H-H' between an end of the cell and lines E-E' and F-F', and taken along a plane defined by line A-A' between lines E-E' and F-F', and as seen from a direction $D_1$. The cell 101 is so shown to illustrate a geographic relationship between the contact plug 159a connected to the bit line 240 and the other elements of the cell 101. A fifth insulating film 158 may be formed on the first power source line 230 and the fourth insulating film 156. The fifth insulating film 158 may include an interlayer insulating layer. Ninth and tenth contact holes 158a and 158b may be formed in the fifth insulating film 158 by etching the fifth insulating film 158. The ninth and the tenth contact holes 158a and 158b may expose portions of the fifth and sixth connection regions 215c and 215d which are extended from the fifth and sixth drain regions 215a and 215b of the first and second transmission transistors PG1 and PG2. Ninth and tenth contact plugs 159a and 159b may be formed in the ninth and tenth contact holes 158a and 158b respectively. The ninth and tenth contact plugs 159a and 159b mat be silicon plugs or metal plugs.

First and second bit lines 240 and 245, which are electrically connected to the ninth and tenth contact plugs 158a and 158b, may be formed on the fifth insulating film 158. The first and second bit lines 240 and 245 may be metal lines, for example. The first and second bit lines 240 and 245 may be electrically connected to the fifth and sixth drain regions 215a and 215b of the first and second transmission transistors PG1 and PG2 in each of the cell regions 101 through the fifth and sixth connection regions 215c and 215d arranged in the cell regions 101.

In the full CMOS SRAM according to an embodiment of the inventive concept, SRAM cells arranged in each of the cell regions 101 may be mirrored in the first direction and the second direction.

Figure 4:
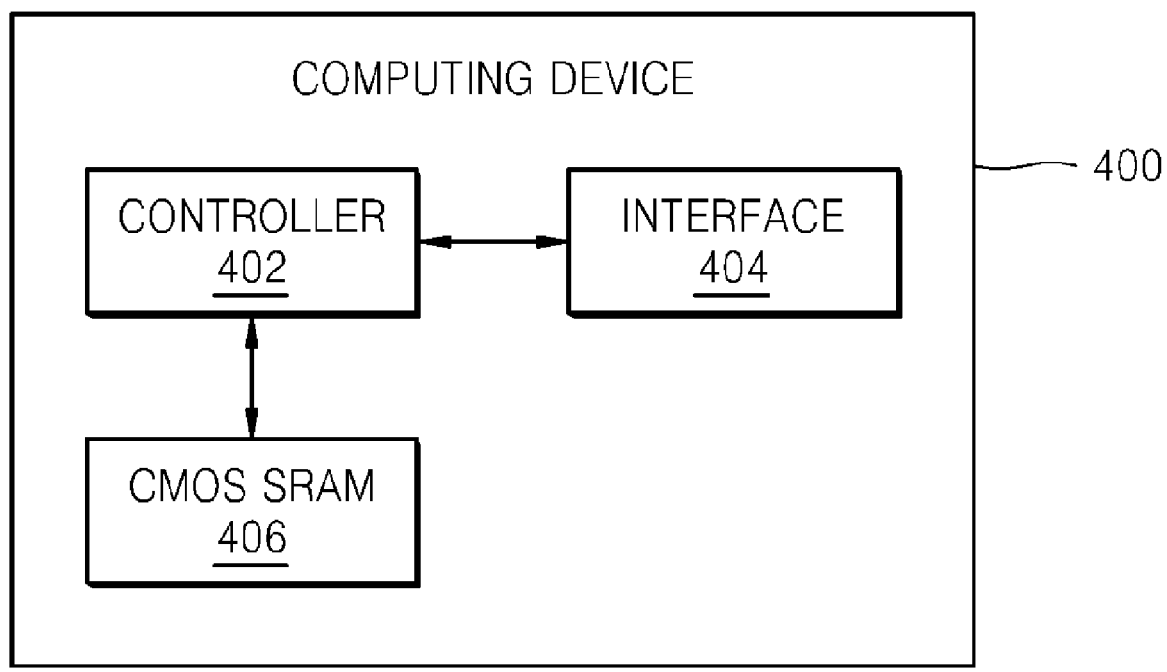
FIG. 4 illustrates a computing device including a CMOS SRAM according to an embodiment of the present general inventive concept.

FIG. 4 illustrates a computing device 400 including a controller 402, an interface 404, and a CMOS SRAM device 406. The CMOS SRAM device includes one or more cells 110 illustrated in FIGS. 1-3J. The controller 402 may receive commands from the interface 404 to access the CMOS SRAM 406. For example, the controller 402 may read data from or write data to the CMOS device 406. The controller 402 may be a processor, a processor combined with memory, or other hardware capable of accessing the CMOS device 406. The interface 404 may be a user interface or any other type of interface integral with the computing device 400. For example, the interface 404 may be a keypad or keyboard and a display. Alternatively, the interface 404 may be a port or other connection to connect with an external device to communicate with the external device. The interface 404 may communicate with an external device via wires, wirelessly, or any other communication means.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A full complementary metal-oxide semiconductor (CMOS) static random access memory (SRAM) comprising:
    a semiconductor substrate having a plurality of cell regions arranged in an array form in a first direction and a second direction perpendicular to the first direction; and
    at least one memory cell arranged in each of the cell regions,
    wherein each at least one memory cell comprises:
    a pair of first transistors arranged on the semiconductor substrate;
    a pair of second transistors arranged on a first layer over the semiconductor substrate;
    a pair of third transistors arranged in a second layer over the first layer;
    a word line that comprises gates of the pair of third transistors and is arranged in a straight line in the first direction; and
    a pair of bit lines arranged to cross the word line in the second direction.

2. The full CMOS SRAM of claim 1, wherein the word line extends in a straight line in the first direction across the cell regions arranged in the first direction and is arranged parallel to the word lines arranged in the cell regions neighboring in the second direction.

3. A full complementary metal-oxide semiconductor (CMOS) static random access memory (SRAM) comprising:
    a semiconductor substrate having a first active region and a second active region which are arranged apart from each other and extend in a first direction;
    a first transistor that is arranged in the first active region and comprises a first gate, a first source region, and a first drain region;
    a second transistor that is arranged in the second active region and comprises a second gate, a second source region, and a second drain region;
    a third transistor that is arranged in a first layer over the semiconductor substrate and comprises a third gate, a third source region, and a third drain region;
    a fourth transistor that is arranged in the first layer and comprises a fourth gate, a fourth source region, and a fourth drain region;
    a fifth transistor that is arranged in a second layer over the first layer and comprises a fifth gate, a fifth source region, and a fifth drain region;
    a sixth transistor that is arranged in the second layer and comprises a sixth gate, a sixth source region, and a sixth drain region; and
    a word line arranged in a straight line over the second layer in a second direction crossing the first direction between the first gate and the second gate and between the third gate and the fourth gate.

4. The full CMOS SRAM of claim 3, wherein
    the first drain region, the third drain region, and the fifth source region are electrically connected to each other via a first contact node,
    the second gate and the fourth gate are electrically connected to the first contact node,
    the second drain region, the fourth drain region, and the sixth source region are electrically connected to each other through a second contact node, and
    the first gate and the second gate are electrically connected to the second contact node.

5. The full CMOS SRAM of claim 4, wherein the word line is arranged in a straight line in the second direction between the first contact node and the second contact node.

6. The full CMOS SRAM of claim 4, wherein
    the first contact node comprises:
    a first contact plug arranged over the semiconductor substrate to electrically connect the first drain region, the third drain region, and the second gate; and
    a second contact plug arranged over the first layer to electrically connect the third drain region, the fifth source region, and the fourth gate, and
    the second contact node comprises:
    a third contact plug arranged over the semiconductor substrate to electrically connect the second drain region, the fourth drain region, and the first gate; and
    a fourth contact plug arranged over the first layer to electrically connect the fourth drain region, the sixth source region, and the third gate.

7. The full CMOS SRAM of claim 4, wherein
    the first layer comprises first and second semiconductor layers arranged over the semiconductor substrate to overlap the first and second active regions,
    the third and fourth gates overlap the first and second gates, and are arranged to cross the first and second semiconductor layers in the second direction, and
    the third and fourth source regions and the third and fourth drain regions are arranged in the first and second semiconductor layers on both sides of the third and fourth gates.

8. The Full CMOS SRAM of claim 7, wherein
    the second layer comprises third and fourth semiconductor layers that are arranged over the first and second semiconductor layers to overlap the first and second active regions and the first and second semiconductor layers, and
    the fifth and sixth gates overlap the first and second gates and the third and fourth gates and are arranged to cross the third and fourth semiconductor layers in the second direction.

9. The full CMOS SRAM of claim 8, wherein
    the fifth gate comprises a first portion of the word line that overlaps the third semiconductor layer, and
    the sixth gate comprises a second portion of the word line that overlaps the fourth semiconductor layer.

10. The full CMOS SRAM of claim 8, wherein the first through fourth semiconductor layers are silicon layers.

11. A CMOS SRAM device, comprising:
    at least one cell, comprising:
    a first layer including a first transistor and a second transistor,
    a second layer above the first layer including a third transistor and a fourth transistor, and
    a third layer including a fifth transistor and a sixth transistor,
    wherein each transistor of the first through sixth transistors comprises a source and a drain, each extending in a first direction, and a gate extending in a second direction to cross the first direction, and
    a gate of the fifth transistor is connected to and linearly contiguous with a gate of the sixth transistor.

12. The CMOS SRAM device according to claim 11, wherein a source of the third and fourth transistors is connected to a first voltage source and a source of the first and second transistors is connected to a second voltage source.

13. The CMOS SRAM device according to claim 12, wherein the second voltage source is a ground source.

14. The CMOS SRAM device according to claim 11, further comprising:
a first electrical node and a second electrical node,
wherein the first electrical node is connected to a drain of the first and third transistors, a source of the fifth transistor, and a gate of the second and fourth transistors, and
the second electrical node is connected to a drain of the second and fourth transistors, a source of the sixth transistor, and a gate of the first and third transistors.

15. The CMOS SRAM device according to claim 14, wherein each node comprises a conductive plug.

16. The CMOS SRAM device according to claim 14, wherein the gates of the first through fourth transistors, respectively, comprise a main portion extending in a first direction and an offset portion extending in the first direction and offset from the main portion by a predetermined distance in a second direction perpendicular to the first direction,
the main portions of the first through fourth transistors are connected to the sources and drains of the respective first through fourth transistors, and
the offset portions of the gates of the first through fourth transistors are connected to the respective nodes.

17. The CMOS SRAM device according to claim 11, wherein the first layer includes a substrate and a first sub-layer above the substrate,
the sources and drains of the first and second transistors are located in the substrate, are separated from each other, and are substantially parallel to each other, and
the gates of the first and second transistors extend parallel to each other in the first sub-layer.

18. The CMOS SRAM device according to claim 17, wherein the second layer includes a first semiconductor layer and a second sub-layer above the first semiconductor layer,
the sources and drains of the third and fourth transistors are located in the first semiconductor layer, are separated from each other, and are substantially parallel to each other, and
the gates of the third and fourth transistors extend parallel to each other in the second sub-layer.

19. The CMOS SRAM device according to claim 18, wherein the third layer includes a second semiconductor layer and a third sub-layer above the second semiconductor layer,
the sources and drains of the fifth and sixth transistors are located in the second semiconductor layer, are separated from each other, and are substantially parallel to each other, and
a word line extends across the first cell in a line between the gates of the first through fourth transistors and includes a gate of the fifth transistor and a gate of the sixth transistor.

20. The CMOS SRAM device according to claim 19, further comprising:
a plurality of bit lines extending in lines parallel to each other and crossing the word line, a first bit line of the plurality of bit lines connected to a drain of the fifth transistor and a second bit line of the plurality of bit lines connected to a drain of the sixth transistor.

21. The CMOS SRAM device according to claim 19, wherein the source and drain of the first transistor are located in a main portion of a first active region of the substrate,
the source and drain of the second transistor are located in a main portion of a second active region of the substrate,
the main portions of the first and second active regions of the substrate extend parallel to each other, and
each of the first and second active regions of the substrate include protrusions located at an end of the main portion and extending perpendicular to the main portion.

22. The CMOS SRAM device according to claim 19, wherein the source and drain of the third transistor are located in a first main portion of the first semiconductor layer,
the source and drain of the fourth transistor are located in a second main portion of the first semiconductor layer,
the first and second main portions of the first semiconductor layer extend parallel to each other, and
the first semiconductor layer further comprises:
a first protrusion connected to an end of the first main portion of the first semiconductor layer and extending perpendicular to the first main portion; and
a second protrusion connected to an end of the second main portion of the first semiconductor layer and extending perpendicular to the second main portion.

23. The CMOS SRAM device according to claim 19, wherein the source and drain of the fifth transistor are located in a first main portion of the second semiconductor layer,
the source and drain of the sixth transistor are located in a second main portion of the second semiconductor layer,
the first and second main portions of the second semiconductor layer extend parallel to each other, and
the second semiconductor layer further comprises:
a first protrusion connected to an end of the first main portion of the second semiconductor layer and extending perpendicular to the first main portion; and
a second protrusion connected to an end of the second main portion of the second semiconductor layer and extending perpendicular to the second main portion.

24. The CMOS SRAM device according to claim 23, wherein the first and second main portions of the second semiconductor layer extend in a first direction,
the first and second protrusions extend in a second direction perpendicular to the first direction, and
the sources of the first, third, and fifth transistors are stacked one above the other in a third direction perpendicular to both the first and second directions,
the drains of the second, second, fourth, and sixth transistors are stacked one above the other in the third direction,
the gates of the first and third transistors are stacked one above the other in the third direction, and
the gates of the second and fourth transistors are stacked one above the other in the third direction.

25. The CMOS SRAM device according to claim 11, wherein the gates of the first through sixth transistors comprise at least one of a single layer formed of polysilicon, a stack of polysilicon film layers, a metal layer, and a metal silicide layer.

26. The CMOS SRAM device according to claim 11, wherein the at least one cell comprises a plurality of cells arranged in an array, and
a structure of one cell mirrors a structure of an adjacent cell.

* * * * *